(12) United States Patent
Mandelman et al.

(10) Patent No.: US 7,754,513 B2
(45) Date of Patent: Jul. 13, 2010

(54) LATCH-UP RESISTANT SEMICONDUCTOR STRUCTURES ON HYBRID SUBSTRATES AND METHODS FOR FORMING SUCH SEMICONDUCTOR STRUCTURES

(75) Inventors: Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/680,083

(22) Filed: Feb. 28, 2007

(65) Prior Publication Data

US 2008/0217690 A1 Sep. 11, 2008

(51) Int. Cl.
*H01L 21/20* (2006.01)

(52) U.S. Cl. .................. 438/44; 438/41; 438/222; 438/269; 438/360; 257/618; 257/619; 257/621; 257/623; 257/E21.131; 257/E21.133; 257/E21.461; 257/E21.562

(58) Field of Classification Search ................. 438/298, 438/450, 41, 44, 222, 269, 360; 257/349, 257/354, 623, E21.09, 618, 619, 621, E21.131, 257/E21.133, E21.461, E21.562
See application file for complete search history.

(56) References Cited

U.S. PATENT DOCUMENTS

| | | | |
|---|---|---|---|
| 3,356,543 A * | 12/1967 | Desmond et al. | ............. 438/543 |
| 4,454,647 A | 6/1984 | Joy et al. | |
| 4,495,025 A | 1/1985 | Haskell | |
| 4,609,934 A | 9/1986 | Haskell | |
| 4,615,104 A | 10/1986 | Kameyama et al. | |
| 4,948,624 A | 8/1990 | Rivaud et al. | |
| 4,956,693 A | 9/1990 | Sawahata et al. | |
| 5,015,594 A | 5/1991 | Chu et al. | |
| 5,112,771 A | 5/1992 | Ishii et al. | |
| 5,130,268 A | 7/1992 | Liou | |
| 5,183,775 A | 2/1993 | Levy | |
| 5,393,693 A | 2/1995 | Ko et al. | |
| 5,445,989 A | 8/1995 | Lur et al. | |
| 5,536,675 A | 7/1996 | Bohr | |
| 5,658,816 A | 8/1997 | Rajeevakumar | |

(Continued)

FOREIGN PATENT DOCUMENTS

JP        04037152        2/1992

OTHER PUBLICATIONS

Office Action issued in related U.S. Appl. No. 11/340,737; dated Mar. 27, 2007; 5 pages; USPTO.

(Continued)

*Primary Examiner*—Davienne Monbleau
*Assistant Examiner*—Eduardo A Rodela
(74) *Attorney, Agent, or Firm*—Wood, Herron & Evans, LLP

(57) ABSTRACT

Latch-up resistant semiconductor structures formed on a hybrid substrate and methods of forming such latch-up resistant semiconductor structures. The hybrid substrate is characterized by first and second semiconductor regions that are formed on a bulk semiconductor region. The second semiconductor region is separated from the bulk semiconductor region by an insulating layer. The first semiconductor region is separated from the bulk semiconductor region by a conductive region of an opposite conductivity type from the bulk semiconductor region. The buried conductive region thereby the susceptibility of devices built using the first semiconductor region to latch-up.

26 Claims, 10 Drawing Sheets

U.S. PATENT DOCUMENTS

| | | | |
|---|---|---|---|
| 5,783,476 | A | 7/1998 | Arnold |
| 5,807,784 | A | 9/1998 | Kim |
| 5,844,294 | A * | 12/1998 | Kikuchi et al. ............... 257/510 |
| 5,895,251 | A | 4/1999 | Kim |
| 5,895,253 | A | 4/1999 | Akram |
| 5,937,286 | A | 8/1999 | Abiko |
| 5,972,776 | A | 10/1999 | Bryant |
| 5,994,200 | A | 11/1999 | Kim |
| 6,001,709 | A | 12/1999 | Chuang et al. |
| 6,018,174 | A | 1/2000 | Schrems et al. |
| 6,137,152 | A | 10/2000 | Wu |
| 6,207,532 | B1 | 3/2001 | Lin et al. |
| 6,214,696 | B1 | 4/2001 | Wu |
| 6,294,419 | B1 | 9/2001 | Brown et al. |
| 6,365,952 | B1 | 4/2002 | Akram |
| 6,432,798 | B1 | 8/2002 | Liu et al. |
| 6,455,363 | B1 * | 9/2002 | Puchner et al. ............. 438/223 |
| 6,476,445 | B1 | 11/2002 | Brown et al. |
| 6,518,641 | B2 | 2/2003 | Mandelman et al. |
| 6,576,558 | B1 | 6/2003 | Lin |
| 6,590,271 | B2 | 7/2003 | Liu et al. |
| 6,645,835 | B1 | 11/2003 | Yamoto et al. |
| 6,653,678 | B2 | 11/2003 | Chidambarrao et al. |
| 6,670,234 | B2 | 12/2003 | Hsu et al. |
| 6,689,655 | B2 | 2/2004 | Coronel et al. |
| 6,828,191 | B1 | 12/2004 | Wurster et al. |
| 6,830,962 | B1 * | 12/2004 | Guarini et al. ............... 438/149 |
| 6,898,778 | B2 | 5/2005 | Kawanaka |
| 6,900,091 | B2 | 5/2005 | Williams et al. |
| 6,903,384 | B2 | 6/2005 | Hsu et al. |
| 6,905,944 | B2 | 6/2005 | Chudzik et al. |
| 6,995,054 | B2 | 2/2006 | Oda et al. |
| 7,045,397 | B1 | 5/2006 | Yu et al. |
| 7,078,324 | B2 | 7/2006 | Dudek et al. |
| 7,081,378 | B2 | 7/2006 | Zheng et al. |
| 7,109,110 | B2 | 9/2006 | Hshieh |
| 7,122,867 | B2 | 10/2006 | Liou |
| 7,176,104 | B1 | 2/2007 | Chen et al. |
| 7,247,553 | B2 | 7/2007 | Ohayashi et al. |
| 7,276,768 | B2 | 10/2007 | Furukawa et al. |
| 7,456,447 | B2 | 11/2008 | Tatsumi |
| 7,525,163 | B2 | 4/2009 | Vora |
| 2003/0017710 | A1 | 1/2003 | Yang et al. |
| 2003/0119245 | A1 * | 6/2003 | Iwamatsu et al. ............ 438/207 |
| 2003/0170964 | A1 | 9/2003 | Kao et al. |
| 2004/0033666 | A1 | 2/2004 | Williams et al. |
| 2004/0102017 | A1 | 5/2004 | Chang et al. |
| 2004/0222529 | A1 * | 11/2004 | Dostalik et al. ............. 257/758 |
| 2005/0004595 | A1 | 1/2005 | Boyle et al. |
| 2005/0020003 | A1 | 1/2005 | Johansson et al. |
| 2005/0045952 | A1 | 3/2005 | Chatty et al. |
| 2005/0085028 | A1 | 4/2005 | Chatty et al. |
| 2005/0142803 | A1 | 6/2005 | Chun |
| 2005/0179111 | A1 | 8/2005 | Chao |
| 2005/0191812 | A1 | 9/2005 | Pritchard et al. |
| 2006/0003596 | A1 | 1/2006 | Fucsko et al. |
| 2006/0065923 | A1 | 3/2006 | Pfirsch |
| 2006/0113589 | A1 | 6/2006 | Jones |
| 2006/0134882 | A1 | 6/2006 | Zhang |
| 2007/0033548 | A1 | 2/2007 | Tatsumi |
| 2007/0158755 | A1 | 7/2007 | Chang et al. |
| 2007/0158779 | A1 | 7/2007 | Cannon et al. |
| 2007/0170518 | A1 | 7/2007 | Furukawa et al. |
| 2007/0170543 | A1 | 7/2007 | Furukawa et al. |
| 2007/0194403 | A1 | 8/2007 | Cannon et al. |
| 2007/0241409 | A1 | 10/2007 | Furukawa et al. |
| 2008/0057671 | A1 | 3/2008 | Furukawa et al. |
| 2008/0157202 | A1 * | 7/2008 | Cannon et al. ............... 257/351 |
| 2008/0164494 | A1 | 7/2008 | Pagette et al. |
| 2008/0203492 | A1 | 8/2008 | Cannon et al. |
| 2008/0203522 | A1 | 8/2008 | Mandelman et al. |
| 2008/0217698 | A1 | 9/2008 | Furukawa et al. |
| 2008/0230852 | A1 | 9/2008 | Yu et al. |
| 2008/0237663 | A1 | 10/2008 | Hanafi |
| 2008/0242016 | A1 | 10/2008 | Cannon et al. |
| 2008/0265338 | A1 | 10/2008 | Yu et al. |
| 2008/0268610 | A1 | 10/2008 | Furukawa et al. |

OTHER PUBLICATIONS

Notice of Allowance issued in related U.S. Appl. No. 11/340,737; dated Jun. 1, 2007; 4 pages; USPTO.

Office Action issued in related U.S. Appl. No. 11/340,752; dated Jun. 17, 2008; 35 pages; USPTO.

Office Action issued in a related U.S. Appl. No. 11/360,345, dated Aug. 29, 2008; 12 pages; U.S. Patent and Trademark Office.

M. Yang et al., "High Performance CMOS Fabricated on Hybrid Substrate With Different Crystal Orientations," IEEE, 2003.

M. Yang et al., "On the Integration of CMOS with Hybrid Crystal Orientations," IEEE, 2004 Symposium on VLSI Technology Digest of Technical Papers.

U.S. Patent and Trademark Office, Office Action dated as mailed on Feb. 5, 2009 for related U.S. Appl. No. 11/330,688, 13 pages.

U.S. Patent and Trademark Office, Office Action dated as mailed on Nov. 14, 2008 for related U.S. Appl. No. 12/125,381, 12 pages.

U.S. Patent and Trademark Office, Office Action dated as mailed on Nov. 28, 2008 for related U.S. Appl. No. 11/927,135, 10 pages.

U.S. Patent and Trademark Office, Office Action dated as mailed on Dec. 12, 2008 for related U.S. Appl. No. 12/169,806, 10 pages.

"Oxidation", Apr. 11, 2005, http://www.answers.com/topic/oxidation, definition 1, 4 pages.

"Oxidation and Reduction", Dec. 25, 2003, http://hyperphysics.phy-ast.gsu.edu/HBASE/chemical/oxred.html, 4 pages.

Notice of Allowance issued in related U.S. Appl. No. 11/330,689; dated as mailed on Sep. 4, 2009; U.S. Patent and Trademark Office.

U.S. Patent and Trademark Office, Office Action dated as mailed on Apr. 7, 2009 for related U.S. Appl. No. 11/764,571.

U.S. Patent and Trademark Office, Office Action dated as mailed on Mar. 10, 2009 for related U.S. Appl. No. 11/360,345, 8 pages.

U.S. Patent and Trademark Office, Office Action dated as mailed on Mar. 11, 2009 for related U.S. Appl. No. 12/117,232, 14 pages.

Office Action issued in a related U.S. Appl. No. 11/330,688; dated as mailed on Aug. 12, 2008; 12 pages; U.S. Patent and Trademark Office.

Office Action issued in a related U.S. Appl. No. 11/330,689; dated as mailed on Nov. 5, 2008; 6 pages; U.S. Patent and Trademark Office.

Notice of Allowance issued in a related U.S. Appl. No. 11/340,752; dated as mailed on Oct. 3, 2008; 6 pages; U.S. Patent and Trademark Office.

J. Ruzyllo, Semiconductor Glossary [online], [retrieved on Nov. 12, 2008]. Retrieved from the Internet <URL: http://www.semiconductorglossary.com/default.asp?searchterm=sub-collector+contact>.

J. Ruzyllo, Semiconductor Glossary [online], [retrieved on Nov. 12, 2008]. Retrieved from the Internet <URL: http://www.semiconductorglossary.com/default.asp?searchterm=channel+stop>.

U.S. Patent and Trademark Office, Office Action dated as mailed on Feb. 13, 2008 for related U.S. Appl. No. 11/360,345.

U.S. Patent and Trademark Office, Office Action dated as mailed on May 12, 2009 for related U.S. Appl. No. 11/927,135.

Office Action issued in related U.S. Appl. No. 11/330,689; dated May 14, 2009.

U.S. Patent and Trademark Office, Office Action dated as mailed on Feb. 5, 2009 for related U.S. Appl. No. 11/330,688.

U.S. Patent and Trademark Office, Office Action dated as mailed on Dec. 12, 2008 for related U.S. Appl. No. 12/169,806.

U.S. Patent and Trademark Office, Office Action dated as mailed on May 6, 2009 for related U.S. Appl. No. 12/125,381, 12 pages.

U.S. Patent and Trademark Office, Office Action dated as mailed on Jul. 2, 2009 for related U.S. Appl. No. 11/330,688.

U.S. Patent and Trademark Office, Notice of Allowance dated as mailed on Sep. 28, 2009 for related U.S. Appl. No. 11/764,571.
U.S. Patent and Trademark Office, Notice of Allowance dated as mailed on Aug. 25, 2009 for related U.S. Appl. No. 11/927,135.
U.S. Patent and Trademark Office, Notice of Allowance dated as mailed on Sep. 14, 2009 for related U.S Appl. No. 12/125,381.

U.S. Patent and Trademark Office, Notice of Allowance dated as mailed on Jan. 14, 2010 for related U.S. Appl. No. 12/169,806.
USPTO, Office Action issued in related U.S. Appl. No. 11/876,062 dated Feb. 8, 2010.

* cited by examiner

LATCH-UP RESISTANT SEMICONDUCTOR STRUCTURES ON HYBRID SUBSTRATES AND METHODS FOR FORMING SUCH SEMICONDUCTOR STRUCTURES

FIELD OF THE INVENTION

The invention relates to semiconductor structures and methods and, in particular, to latch-up resistant semiconductor structures for complementary metal-oxide-semiconductor device circuits constructed using hybrid substrates with bulk and SOI device regions and methods for fabricating such latch-up resistant semiconductor structures.

BACKGROUND OF THE INVENTION

Complementary metal-oxide-semiconductor (CMOS) circuits include n-channel field effect transistors (nFETs), in which electron carriers are responsible for conduction in the channel, and p-channel field effect transistors (pFETs), in which hole carriers are responsible for conduction in the channel. CMOS circuits have been traditionally fabricated on silicon wafers having a single crystal orientation, ordinarily a (100) crystal orientation. Electrons have a higher mobility in silicon characterized by a (100) crystal orientation in comparison with silicon of a (110) crystal orientation. In contrast, holes have higher mobility in silicon characterized by a (110) crystal orientation in comparison with silicon of a (100) crystal orientation.

In recognition of this ability to optimize transistor performance, hybrid orientation technology (HOT) has evolved to produce hybrid substrates characterized by device regions of different crystal orientations that are carried on a common bulk substrate. Using such hybrid substrates, CMOS circuits can be fabricated with nFETs formed in silicon device regions of a (100) crystal orientation and pFETs formed in silicon device regions of a (110) crystal orientation. Consequently, the performance of the different transistor types in the CMOS circuit can be individually optimized.

Hybrid substrates may include bulk device regions and semiconductor-on-insulator (SOI) device regions having different crystal orientations or, under certain circumstances, having the same crystal orientation. Each of the SOI device regions is electrically isolated from the bulk substrate and also from adjacent bulk device regions. Latch-up may represent a significant issue for FETs fabricated using the bulk device regions of a hybrid substrate. For space-based applications, electron-hole pairs generated by high-energy ionizing radiation and particles (e.g., cosmic rays, neutrons, protons, alpha particles) may induce latch-up. Because the CMOS circuit cannot be easily replaced in space flight systems, chip failure induced by latch-up may prove catastrophic. Hence, designing hybrid substrates carrying bulk CMOS devices with a high tolerance to latch-up may be an important consideration for circuit operation in the natural space radiation, as well as in terrestrial environments for military systems and other high reliability commercial applications.

Various types of radiation events may cause latch-up or may cause circuit upset that may lead to latch-up. Single event effects (SEE) are caused by a single particle, typically an alpha particle having energies between 3 MeV and 7 MeV, and are generally a terrestrial event. An SEE type event can cause a single event upset (SEU) in which a single radiation particle upsets a storage circuit (e.g. SRAM, DRAM, latch, flipflop), or can cause a multi-bit upset (MBU). Either SEU or MBU events can lead to single event latchup (SEL). A single event transient (SET) results from a single radiation particle that causes a voltage transient, generally by hitting combinatorial logic. If the transient (or glitch) of the SET latches, it is sometimes termed an SEU. A single event functional interrupt (SEFI) arises from a single particle that causes a device to cease to function and switch to a standby mode. A single event gate rupture represents gate breakdown from a single particle striking the gate of a transistor. Total ionizing dose (TID) is a cumulative effect from trapped holes in oxide layers caused by electron-hole pairs generated by ionizing radiation. The electrons of the electron-hole pairs are mobile enough to escape the oxide layers, which leaves behind residual trapped holes that increase leakage or turn on parasitic devices in the transistors.

Despite the success of hybrid substrates for their intended purpose, improved semiconductor structures and methods are needed to further enhance the latch-up resistance of integrated circuits built using hybrid substrates.

SUMMARY OF THE INVENTION

An embodiment of the invention is directed to a semiconductor structure comprising a substrate including juxtaposed first and second semiconductor regions and a third semiconductor region underlying the first and second semiconductor regions. An insulating layer is disposed between the second semiconductor region and a third semiconductor region. A first conductive region is disposed in the substrate at a location between the first semiconductor region and the third semiconductor region. The first and third semiconductor regions having opposite conductivity types.

Another embodiment of the invention is directed to a method of forming a semiconductor structure using a semiconductor-on-insulator substrate having a semiconductor layer, a bulk region of a first conductivity type underlying the semiconductor layer, and an insulating layer between the semiconductor layer and the bulk region. The method comprises forming an opening having a base intersecting the bulk semiconductor region and sidewalls extending from a top surface of the semiconductor layer through the semiconductor layer and the insulating layer to the base. The method further comprises forming a conductive region of a second conductivity type opposite to the first conductivity type in the bulk semiconductor region and proximate to the base of the opening. The method further comprises filling the opening with a semiconductor material epitaxially grown toward the top surface from the base of the opening.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
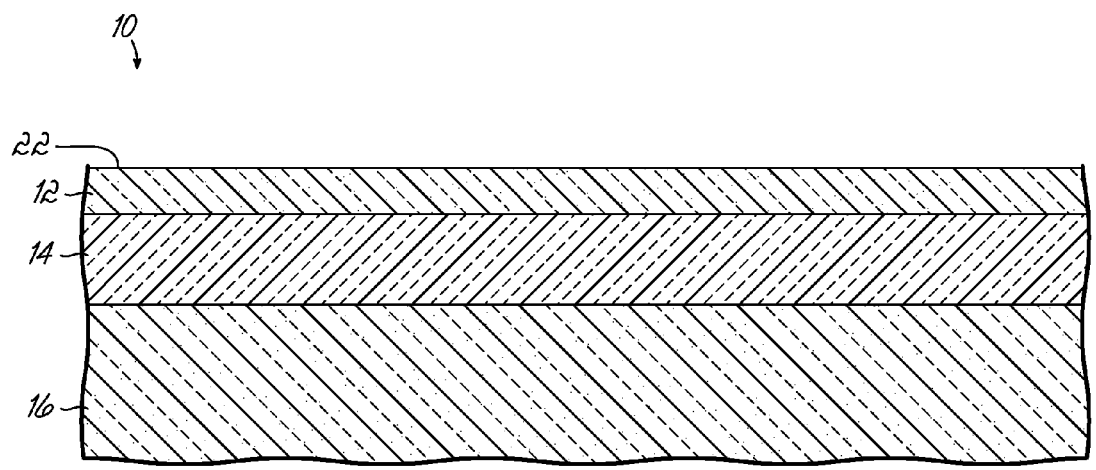
FIGS. 1-12 are diagrammatic cross-sectional views of a portion of a substrate at successive fabrication stages of a processing method in accordance with an embodiment of the invention.

With reference to FIG. 1, a semiconductor-on-insulator (SOI) substrate 10 includes a semiconductor layer 12 with a top surface 22, a buried insulating layer 14, and a handle or bulk region 16 separated from the semiconductor layer 12 by the buried insulator region. The SOI substrate 10 may be fabricated by any suitable technique, such as a wafer bonding and splitting technique. In the representative embodiment, the semiconductor layer 12 is made from a single crystal or monocrystalline silicon-containing material, such as silicon, and the bulk region 16 may likewise be formed from a single crystal or monocrystalline silicon-containing material, such as silicon. The semiconductor layer 12 may be as thin as about 10 nanometers or less and, typically, is in the range of about 20 nanometers to about 150 nanometers, but is not so limited. The thickness of the bulk region 16, which is considerable thicker than the semiconductor layer 12, is not shown to scale in FIG. 1. The buried insulating layer 14 comprises a conventional dielectric material, such as silicon dioxide ($SiO_2$), and may have a thickness in the range of about 50 nanometers to about 150 nanometers, but is not so limited.

The semiconductor layer 12 has a first crystal orientation with crystal planes identified by Miller indices (j,k,l) and the bulk region 16 has a second crystal orientation with crystal planes identified by Miller indices (j',k',l'). For monocrystalline silicon, the respective crystal orientations (j,k,l), (j',k',l') of the semiconductor layer 12 and the bulk region 16 may be selected from among (100), (110), and (111) crystal orientation. The first crystal orientation (j,k,l) of the semiconductor layer 12 may differ from the (j',k',l') crystal orientation of the bulk region 16. For example, the first crystal orientation (j,k,l) of the semiconductor layer 12 may be a (110) crystal orientation and the second crystal orientation (j',k',l') of the bulk region 16 may be a (100) crystal orientation, or vice-versa as described previously. In an alternative embodiment, the first and second crystal orientations (j,k,l), (j',k',l') may be identical.

Figure 2:
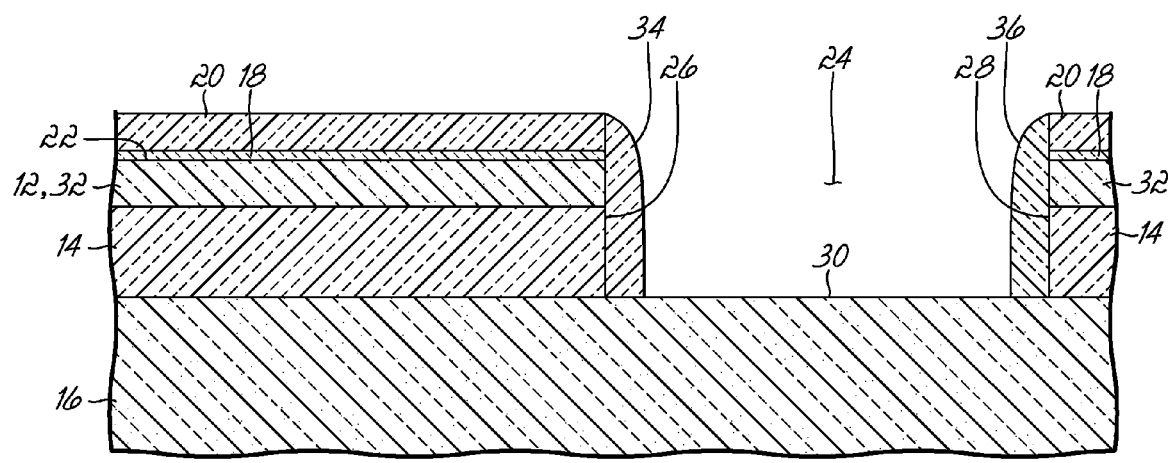

With reference to FIG. 2 in which like reference numerals refer to like features in FIG. 1 and at a subsequent fabrication stage, a pad stack consisting of first and second pad layers 18, 20 is formed on a top surface 22 of semiconductor layer 12. The thinner first pad layer 18 separates the thicker second pad layer 20 from the semiconductor layer 12. The constituent material(s) of pad layers 18, 20 are chosen to etch selectively to the semiconductor material constituting semiconductor layer 12 and to be easily removed at a subsequent stage of the fabrication process. The first pad layer 18 may be $SiO_2$ with a thickness on the order of about 5 nanometers to about 10 nanometers and grown by exposing the semiconductor layer 12 to either a dry oxygen ambient or steam in a heated environment or deposited by a conventional deposition process, such as thermal chemical vapor deposition (CVD). The second pad layer 20 may be a conformal layer of silicon nitride ($Si_3N_4$) with a thickness on the order of about 20 nanometers to about 200 nanometers and deposited by a thermal CVD chemical vapor deposition process like low-pressure chemical vapor deposition (LPCVD) or a plasma-assisted CVD process. The first pad layer 18 may operate as a buffer layer to prevent any stresses in the material constituting the second pad layer 20 from causing dislocations in the semiconductor material of semiconductor layer 12.

Openings, of which a single representative opening 24 is shown, are formed in the semiconductor layer 12 and buried insulating layer 14 by a conventional lithography and etching process that utilizes a pattern imparted in the pad layers 18, 20. The pattern may be created in the pad layers 18, 20 by applying a resist (not shown) on pad layer 20, exposing the resist to a pattern of radiation to create a latent pattern in the resist, and developing the latent pattern in the exposed resist. An anisotropic dry etching process, such as reactive-ion etching (RIE) or plasma etching, may then be used to transfer the pattern from the patterned resist into the pad layers 18, 20. The etching process, which may be conducted in a single etching step or multiple etching steps with different etch chemistries, removes portions of the pad layers 18, 20 visible through the pattern in the patterned resist and stops vertically on the top surface 22 of semiconductor layer 12. After etching is concluded, residual resist is stripped from the pad layers 18, 20 by, for example, plasma ashing or a chemical stripper.

The pattern is then transferred from the patterned pad layers 18, 20 into the underlying semiconductor layer 12 and buried insulator layer 14 with an anisotropic dry etching process that may be constituted by, for example, a RIE process, an ion beam etching process, or a plasma etching process. A first etch chemistry (e.g., a standard silicon RIE process) is employed to extend the pattern through the semiconductor layer 12 that removes the constituent semiconductor material selective to (i.e., with a significantly greater etch rate than) the materials constituting the pad layers 18, 20. A second etch chemistry is subsequently employed to extend the pattern through the buried insulating layer 14 that removes the constituent dielectric material selective to the dielectric material constituting the pad layer 20.

Each of the openings 24, which may have the form of shallow trenches, defines a window extending through the thickness of semiconductor layer 12 and buried insulating layer 14 and exposing a respective surface area of bulk region 16. Each of the openings 24 includes opposite sidewalls 26, 28 that extend through semiconductor layer 12 and buried insulating layer 14 to a bottom surface or base 30 that is coextensive with, or intersects, the bulk region 16. The sidewalls 26, 28 are substantially parallel and are oriented substantially perpendicular to the top surface 22 of semiconductor layer 12 and to the base 30. The conventional lithography and etching process defines a plurality of semiconductor regions 32 from the semiconductor layer 12 that comprise the semiconductor material with the first crystal orientation (j,k,l) of semiconductor layer 12 (FIG. 1). Adjacent semiconductor regions 32 are separated by one of the openings 24 in the patterned semiconductor layer 12 and buried insulating layer 14.

Dielectric spacers 34, 36 are formed on the sidewalls 26, 28, respectively, of each opening 24 and extend from a top surface of the pad layer 20 to the base 30. The dielectric spacers 34, 36 may originate from a conformal layer (not shown) of an electrically insulating material, such as about 10 nanometers to about 50 nanometers of $Si_3N_4$ deposited by CVD, that is shaped by a directional anisotropic etching process preferentially removing the conformal layer from horizontal surfaces. The resistivity of the dielectric spacers 34, 36 is substantially greater than the resistivity of the semiconductor regions 32 and the semiconductor regions 44 (FIG. 4).

Figure 3:
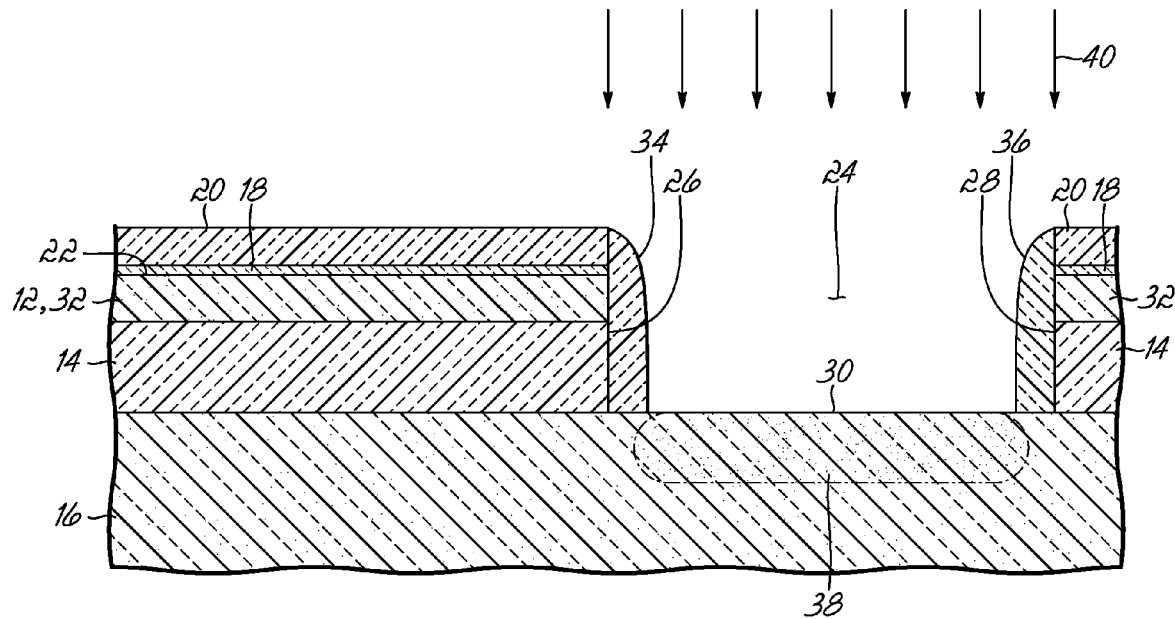

With reference to FIG. 3 in which like reference numerals refer to like features in FIG. 2 and at a subsequent fabrication stage, a buried conductive region 38 is defined in the semiconductor material of bulk region 16 near the base 30 of each opening 24. The buried conductive region 38 may be formed by implanting ions 40 formed from a working gas containing an n-type or p-type dopant species with near normal incidence so that the ions 40 impinge the base 30 of each opening 24. The impinging ions 40 penetrate into the underlying semiconductor material of bulk region 16 and stop in the bulk region 16. The pad layers 18, 20 operate as implant masks by covering the adjacent semiconductor regions 32. The kinetic energy of the ions 40 is selected such that the ions 40 do not penetrate completely through the pad layers 18, 20. As a result, the pad layers 18, 20 act as a self-aligned implant mask for forming the buried conductive regions 38.

The buried conductive region 38 has a conductivity type opposite to the conductivity type of the bulk region 16. For example, if the bulk region 16 is doped with a p-type dopant species to render it p-type, the ions 40 may comprise an n-type dopant species (e.g., arsenic or phosphorus) implanted at a kinetic energy effective to position the buried conductive region 38 at a shallow depth beneath base 30 and at a dose effective to provide peak concentration in the buried conductive region 38 of about $1 \times 10^{18}$ cm$^{-3}$ to about $1 \times 10^{20}$ cm$^{-3}$. The peak concentration is sufficient to endow the buried conductive region 38 with the opposite conductivity type relative to bulk region 16.

Figure 4:
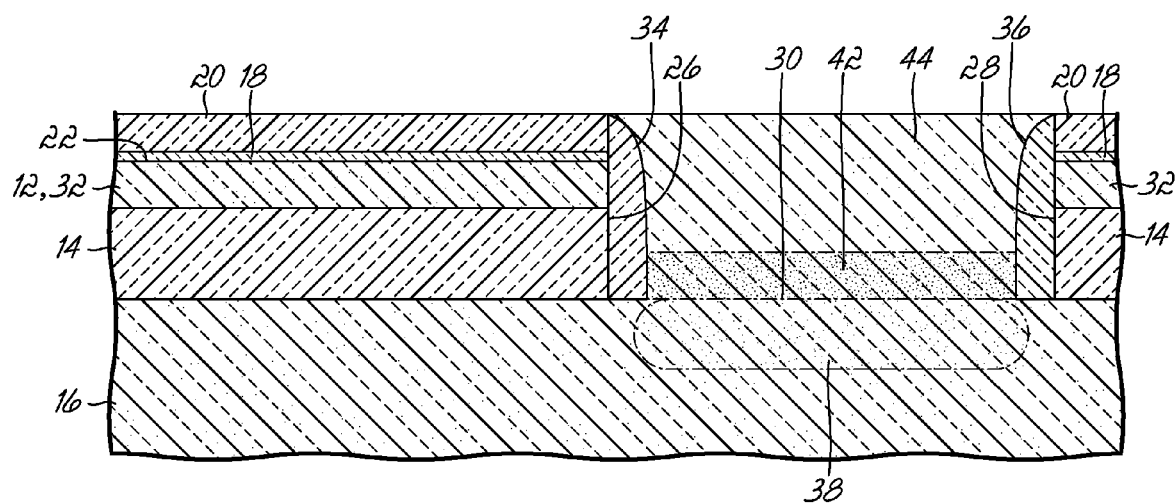

With reference to FIG. 4 in which like reference numerals refer to like features in FIG. 3 and at a subsequent fabrication stage, each of the openings 24 is filled with a buried doped region 42 of epitaxial semiconductor material and a semiconductor region 44 of epitaxial semiconductor material. The buried doped region 42 is located near the base 30 and conductive region 38 and, moreover, is disposed between the semiconductor region 44 and conductive region 38. Each buried doped region 42 may have a thickness of about 10 nanometers to about 100 nanometers. The bulk region 16 underlies the semiconductor regions 32, 44, which are juxtaposed but not contiguous because of the presence of the intervening spacers 34, 36.

Each buried doped region 42 and semiconductor region 44 may contain a concentration of a dopant having the same conductivity type as the bulk region 16. However, each buried doped region 42 contains a significantly higher concentration of the dopant than the semiconductor regions 44. The conductivity type of the regions 42, 44 is opposite from the conductivity type of the buried conductive region 38. A lightly doped region 45 of the same conductivity type as regions 42, 44 may be disposed between the conductive region 38 of the opposite conductivity type and the buried doped region 42 to reduce leakage current. For example, the buried doped region 42 may be doped with a p-type impurity to a peak concentration of about $1 \times 10^{18}$ cm$^{-3}$ to about $1 \times 10^{20}$ cm$^{-3}$, the remainder of each semiconductor region 44 may be doped with a peak concentration of less than about $1 \times 10^{18}$ cm$^{-3}$, and lightly doped region 45 may have a peak concentration of less than about $1 \times 10^{18}$ cm$^{-3}$. As a result of the differential doping, the buried doped region 42 has a greater electrical conductivity than the lightly doped region 45 and the semiconductor region 44.

The monocrystalline semiconductor material of the bulk region 16, which may lightly doped with a p-type dopant species to render it p-type, operates as a seed crystal that sets a crystallographic pattern for the deposited semiconductor material in openings 24 in which this crystallographic pattern is reproduced. In other words, the monocrystalline semiconductor material of the buried doped regions 42 and semiconductor regions 44 will have the same crystal orientation as the crystal orientation (j',k',l') of the semiconductor material of bulk region 16. The pad layers 18, 20 and dielectric spacers 34, 36 isolate the depositing semiconductor material such that the resulting crystal orientation (j',k',l') of the buried doped region 42 and semiconductor region 44 in each opening 24 is unaffected during deposition by the crystal orientation (j,k,l) of the semiconductor regions 32. The semiconductor regions 44 are polished flat and planarized by a chemical-mechanical polishing (CMP) process or any other suitable planarization process. Pad layer 20 acts as a polish stop for the planarization process.

The buried doped regions 42 and semiconductor regions 44 may be composed of silicon formed by a selective epitaxial growth (SEG) process, which is performed at sub-atmospheric process pressures and with a substrate temperature between about 850° C. and about 1050° C. Silicon sources for the SEG process may include, but are not limited to, silicon tetrachloride (SiCl$_4$), trichlorosilane (SiHCl$_3$), and dichlorosilane (SiH$_2$Cl$_2$). Typical SEG process conditions include a sub-atmospheric source pressure of about 40 torr and a substrate temperature of about 900° C. The buried doped regions 42 and semiconductor regions 44 are in situ doped by adding a dopant of an appropriate conductivity type to the silicon source during deposition of the epitaxial semiconductor material. The dopant concentration is modulated during epitaxial grown and, more specifically, is elevated to form each buried doped region 42 and decreased to form the overlying semiconductor region 44. Alternatively, additional dopant may be introduced into each buried doped region 42 by forming an epitaxial layer of the appropriate thickness, interrupting the growth, and implanting ions of a dopant having the appropriate conductivity type.

In an alternative embodiment, at least one of the spacers 34, 36 is fabricated from a conductive material, such as doped polysilicon, tungsten, or tungsten silicide (WSi), rather than an insulator or dielectric material. The resistivity of the conductive spacers 34, 36 is substantially less than the resistivity of the semiconductor regions 32, 44 (FIG. 4). The spacers 34, 36 are disposed between the regions 32, 44 and between the insulating layer 14 and the buried doped region 42.

In this alternative configuration, the semiconductor regions 44 may be used as a common connection to the semiconductor regions 32 and the bulk region 16. The spacers 34 and/or spacers 36, conductive region 38, buried doped regions 42, and semiconductor regions 44 may be doped with the same conductivity type (i.e., either p-type or n-type) contingent upon the desired polarity of the interconnect. The spacers 34, 36 supply a conductive transition layer that provides an electrical connection between the two crystal orientations of the semiconductor regions 32 and the semiconductor regions 44. This conductive transition layer permits the two different orientations to connect with each other without causing structural defects between the two regions 32, 44. The pad layers 18, 20 are removed to expose the top surface 22 of each semiconductor region 32 and a top surface 82 of each semiconductor region 44. The top surfaces 22, 82 are approximately co-planar and may be referred to as a common top surface. The removal and co-planarization may be accomplished by a conventional CMP process.

In another alternative embodiment, the doping of the semiconductor region 44, the buried doped region 42, and buried conductive region 38 can be adjusted when the openings 24 are filled epitaxial semiconductor material such that the buried doped region 42 has an opposite conductivity type than the buried conductive region 38 and the semiconductor region 44. For example, buried doped region 42 may be doped with a p-type dopant to impart p-type conductivity, and the semiconductor region 44 and buried conductive region 38 may be doped with an n-type dopant to impart n-type conductivity.

The regions 38, 42, 44 then define a vertical n-p-n bipolar transistor coupled electrically with the bulk region 16.

In yet another alternative embodiment, an appropriate masking sequence may be used to dope the semiconductor regions 32 and/or the semiconductor regions 44 with both n-type and p-type dopant species. One or both doped regions 32, 44 will accordingly include sub-regions (not shown) of opposite conductivity types for the subsequent fabrication of devices in each sub-region of opposite conductivity type semiconductor material.

Figure 5:
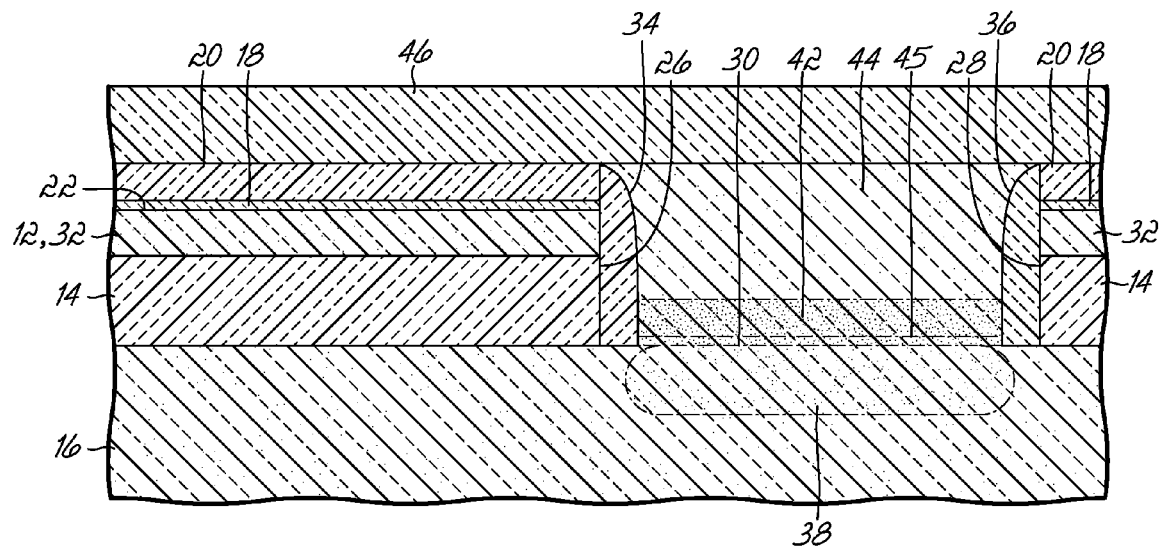

With reference to FIG. 5 in which like reference numerals refer to like features in FIG. 4 and at a subsequent fabrication stage, a pad layer 46 is deposited on the pad layer 20 and the semiconductor regions 44. The pad layer 46 may be a conformal layer of $Si_3N_4$ with a thickness on the order of about 50 nanometers to about 200 nanometers and deposited by a thermal CVD chemical vapor deposition process like LPCVD or a plasma-assisted CVD process. An optional thin pad layer, which is not shown but is similar to pad layer 18, may be deposited on pad layer 20 before pad layer 46 is deposited. The optional thin pad layer is composed of a different dielectric material than pad layer 46, such as $SiO_2$. The optional thin pad layer may operate as an etch stop or marker layer to facilitate the removal of pad layers 20, 26 in subsequent fabrication stages.

Figure 6:
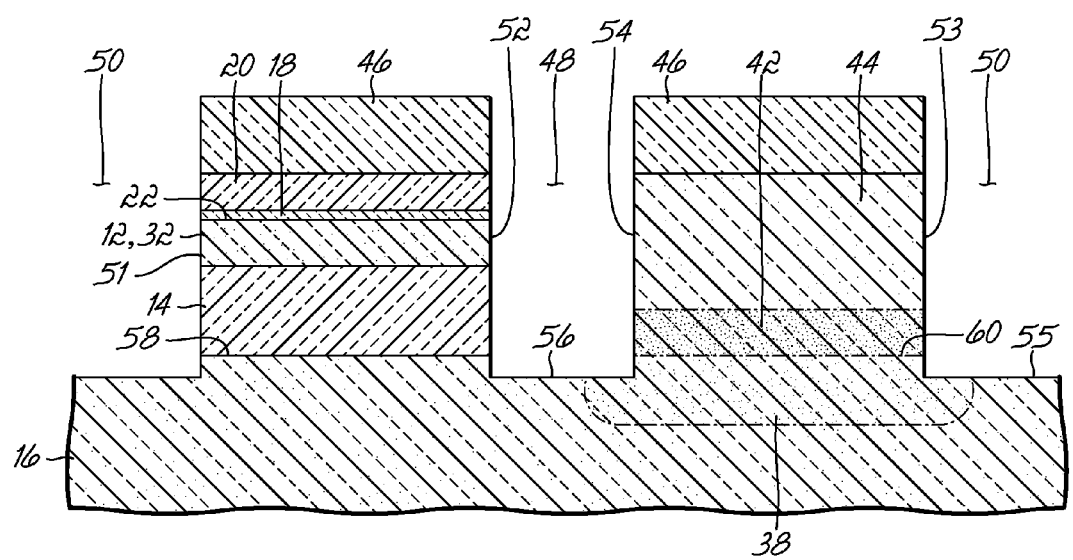

With reference to FIG. 6 in which like reference numerals refer to like features in FIG. 5 and at a subsequent fabrication stage, shallow isolation trenches 48, 50 are formed using a shallow trench pattern imparted in the pad layer 46 by a conventional lithography and anisotropic dry etching process. For example, the shallow trench pattern may be created in pad layer 46 by applying a resist (not shown), exposing the resist to a pattern of radiation to create a latent shallow trench pattern in the resist, developing the latent shallow trench pattern in the exposed resist, transferring the shallow trench pattern from the resist into pad layer 46 with an anisotropic etching process, and stripping the resist to re-expose the patterned pad layer 46.

An anisotropic dry etching process transfers the shallow trench pattern from the patterned pad layer 46 into the bulk region 16. Specifically, the anisotropic etching process deepens the shallow isolation trenches 48, 50 such that the openings extend beyond interfaces 58, 60 into the bulk region 16. The anisotropic dry etching process may be conducted in a single etching step or multiple etching steps with different etch chemistries. Shallow isolation trenches 48, 50 are positioned in the shallow trench pattern such that the etching process removes the dielectric spacers 34, 36, nearby portions of the semiconductor region 32 and buried insulating layer 14, and nearby portions of the buried doped regions 42 and semiconductor regions 44.

The buried conductive region 38 is flanked on one side by one of the shallow isolation trenches 48 and on an opposite side by one of the isolation trenches 50. In one embodiment, the buried conductive region is symmetrically positioned between the adjacent shallow isolation trenches 48, 50. Each shallow isolation trench 48 includes opposite, spaced-apart sidewalls 52, 54 that extend into the bulk region 16 to a base 56. Each shallow isolation trench 50 includes opposite, spaced-apart sidewalls 51, 53 that extend into the bulk region 16 to a base 55.

The bases 55, 56 are located at a depth relative to top surface 22 below the depth of the coextensive interface 58 between the buried insulating layer 14 and bulk region 16 and also at a depth greater than the depth of the coextensive junction or interface 60 between the doped regions 38, 42. Interface 60 is positioned approximately at the former depth of the base 30 of the openings 24 (FIG. 2). In one embodiment, the bases 55, 56 are located at a depth in the bulk region 16 relative to interface 60 that penetrates about halfway through the thickness of the buried conductive region 38 and, in certain embodiments, is near the peak dopant concentration in the buried conductive region 38.

Sidewall 54 of trench 48 and sidewall 53 of trench 50 are adjacent to, and expose opposite vertical surfaces of, the semiconductor region 44. Sidewall 52 of trench 48 and sidewall 51 of trench 50 are adjacent to, and expose opposite vertical surfaces of, the semiconductor region 32. The shallow isolation trenches 48, 50 are positioned so that the buried conductive region 38 intersects the sidewall 54 of trench 48, the sidewall 53 of trench 50, and the bases 55, 56.

Figure 7:
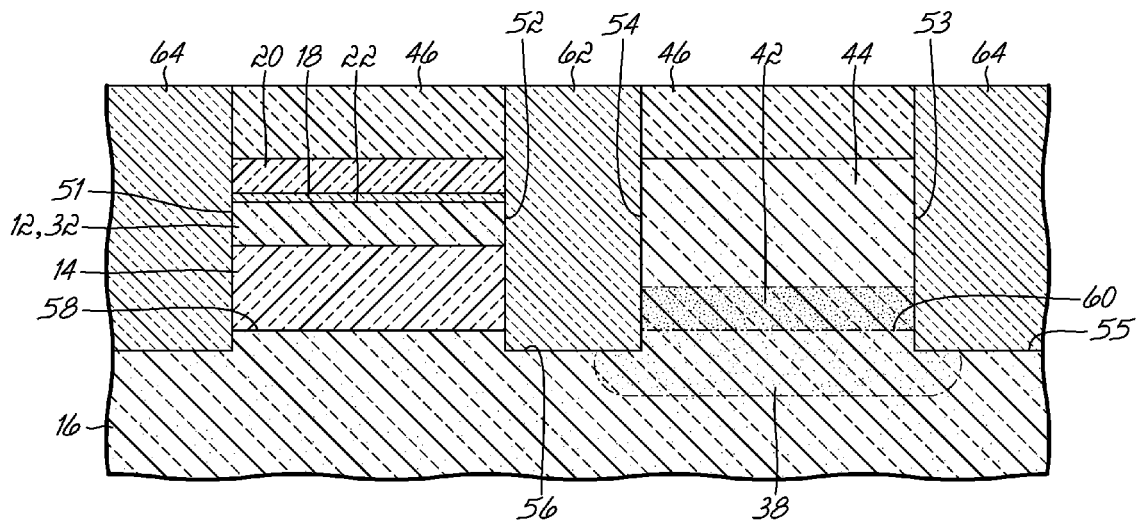

With reference to FIG. 7 in which like reference numerals refer to like features in FIG. 6 and at a subsequent fabrication stage, shallow trench isolation regions 62, 64 are formed by filling the shallow isolation trenches 48, 50, respectively, with an insulating or dielectric material. The dielectric material may comprise high-density-plasma (HDP) oxide or CVD tetraethylorthosilicate (TEOS) deposited across the pad layer 46 and planarized by, for example, a conventional CMP process that stops on the pad layer 46. The shallow trench isolation regions 62, 64 cooperate to electrically isolate adjacent semiconductor regions 32 and semiconductor regions 44. The buried conductive region 38 is thereby self-aligned with the shallow trench isolation regions 62 that flank the semiconductor region 44 and, therefore, is self-aligned with the semiconductor region 44.

Figure 8:
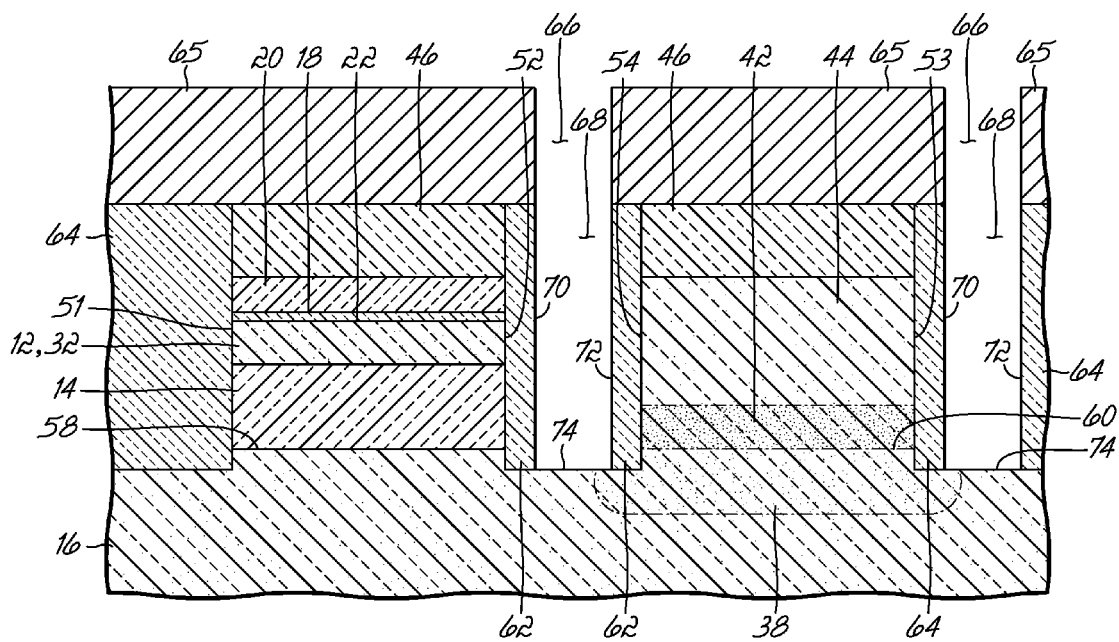

With reference to FIG. 8 in which like reference numerals refer to like features in FIG. 7 and at a subsequent fabrication stage, a layer 65 of a resist is applied to pad layer 46 and shallow trench isolation regions 62, 64 and then patterned using a conventional lithography process to define via openings, of which via openings 66 are representative. An anisotropic etching process is used to etch a via 68 in each of the shallow trench isolation regions 62, 64 at the locations of the via openings 66 in the patterned resist layer 65. The vias 68 are adjacent to and flank each semiconductor region 44. The anisotropic dry etching process may be conducted in a single etching step or multiple etching steps with different etch chemistries. Each of the vias 68 includes sidewalls 70, 72 that extend completely through the corresponding one of the shallow isolation trench 48, 50 to a base 74 that is approximately at the former depth of bases 55, 56 (FIG. 6). The bulk region 16 and, more particularly, one end of the buried conductive region 38 are exposed by the base 74 of each via 68. The vias 68, as well as the adjacent shallow trench isolation regions 62, 64, flank the buried doped region 42 and semiconductor region 44. The vias 68 are electrically isolated from the buried doped region 42 and semiconductor region 44 by intervening residual portions of the shallow trench isolation regions 62, 64.

Figure 9:
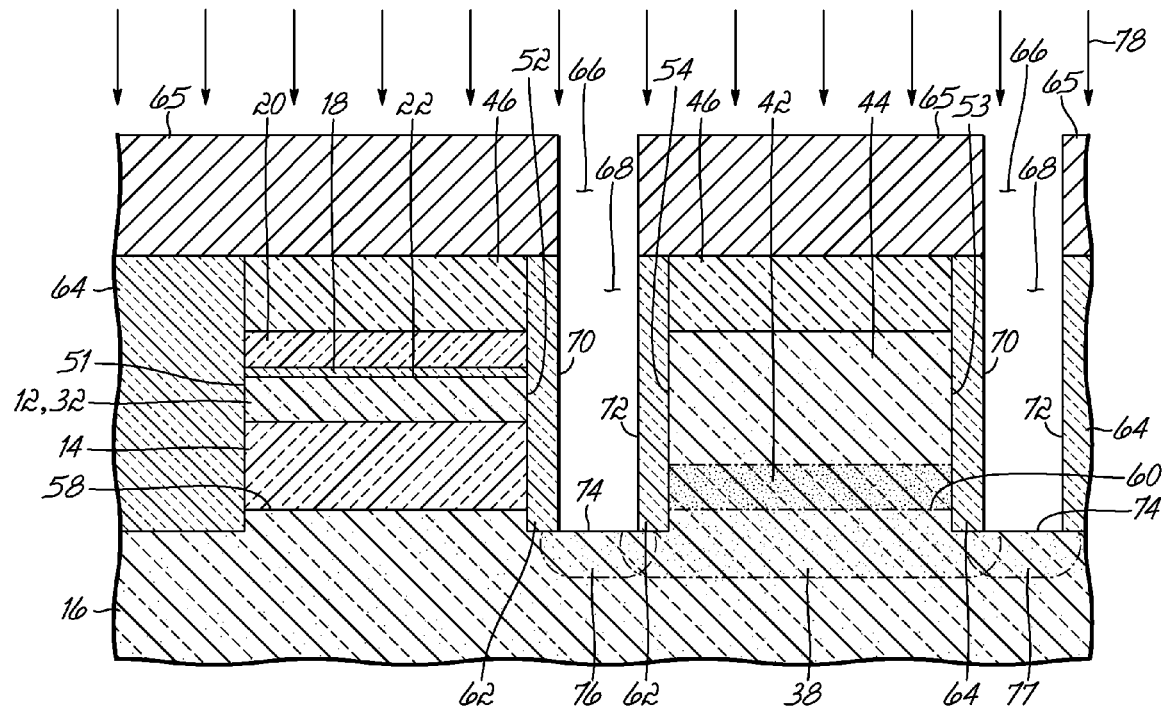

With reference to FIG. 9 in which like reference numerals refer to like features in FIG. 8 and at a subsequent fabrication stage, conductive regions 76, 77 are defined in the semiconductor material of bulk region 16 near the base 74 of each via 68. The conductive regions 76, 77 may be formed by implanting ions 78 with near normal incidence so that the ions 78 impinge the base 74 of each via 68 and penetrate into the underlying semiconductor material of the bulk region 16. The conductive regions 76, 77 have a conductivity type opposite to the conductivity type of the bulk region 16 and of the same conductivity type as the buried conductive region 38. For example, if the bulk region 16 is doped with a p-type dopant, the ions 78 may comprise an n-type dopant (e.g., arsenic or phosphorus) implanted at a kinetic energy so that the concentration of the n-type dopant extends from the base 74 to a depth of about 100 nanometers to about 200 nanometers and at a dose effect to provide peak concentration of about $1\times10^{18}$ $cm^{-3}$ to about $1\times10^{20}$ $cm^{-3}$. The conductive regions 76, 77, which flank opposite sides of the buried conductive region 38, merge with the doped semiconductor material of the buried conductive region 38 to effectively define a continuous volume of semiconductor material in the bulk region 16 that is doped with a similar concentration of a dopant of a common conductivity type opposite to the conductivity type of the bulk region 16.

Figure 10:
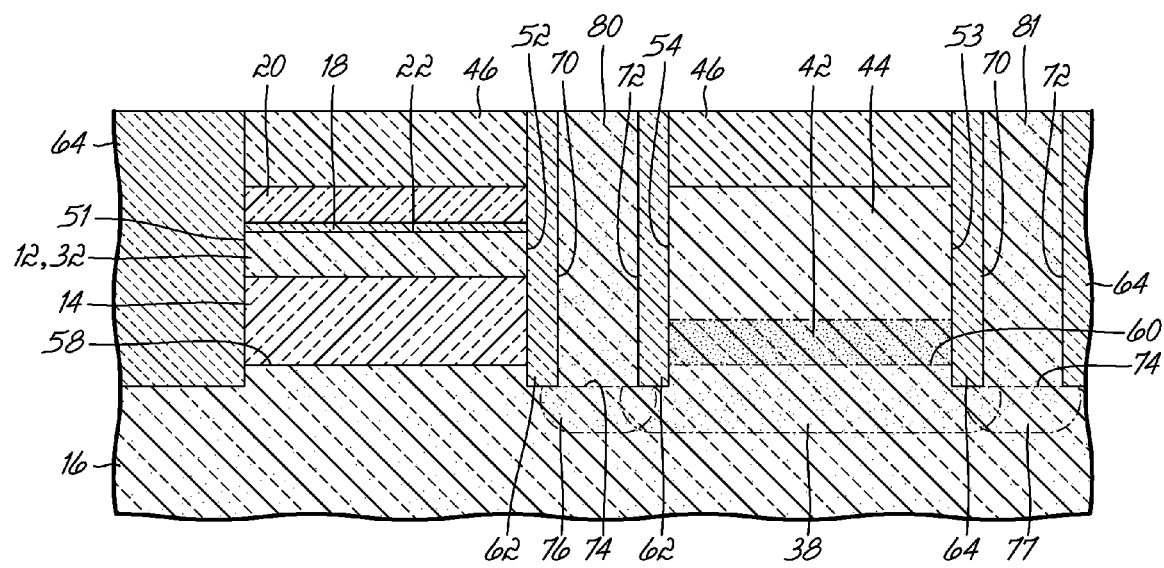

With reference to FIG. 10 in which like reference numerals refer to like features in FIG. 9 and at a subsequent fabrication stage, the resist layer 65 (FIG. 9) is stripped, for example, by plasma ashing or with a chemical stripper. Studs or contacts 80, 81 are formed by filling the each of the vias 68 with an electrically conductive material. The electrically conductive material forming the contacts 80, 81 may be, for example, polycrystalline silicon (polysilicon) deposited by a CVD process and doped with a concentration of the same conductivity type dopant as the buried conductive region 38 and conductive regions 76, 77 and then planarized to the top surface of the pad layer 46, for example, with a conventional CMP process. Each contact 80 is electrically coupled by conductive region 76 with one side of the buried conductive region 38. Each contact 81 is electrically coupled by conductive region 77 with the opposite side of the buried conductive region 38. Consequently, the conductive regions 76, 77 bridge respective gaps in the bulk region 16 between the conductive region 38 and each via 68 (and, therefore, the conductive stud 80 in each via 68).

Figure 11:
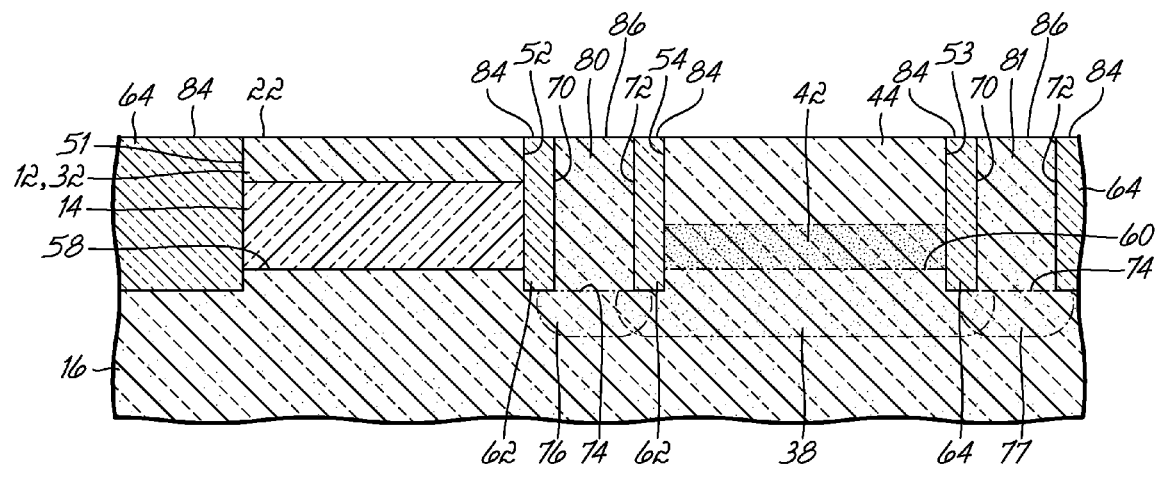

With reference to FIG. 11 in which like reference numerals refer to like features in FIG. 10 and at a subsequent fabrication stage, the pad layers 18, 20, 46 are removed to expose the top surface 22 of each semiconductor region 32 and the top surface 82 of each semiconductor region 44. The top surfaces 22, 82 are approximately co-planar with a top surface 84 of the shortened shallow trench isolation regions 62, 64 and with a top surface 86 of the shortened contacts 80. The removal and co-planarization may be accomplished by a conventional CMP process. Each semiconductor region 32 is electrically isolated from the bulk region 16 by a residual portion of the buried insulating layer 14 and is flanked by shallow trench isolation regions 62, 64 that extend from the top surface 22 to the buried insulating layer 14. Each semiconductor region 44 is physically coupled with the bulk region 16.

Each semiconductor region 32 has a crystal orientation determined by the crystal orientation (j,k,l) of the semiconductor layer 12. Each semiconductor region 44 has a crystal orientation determined by the crystal orientation (j',k',l') of the bulk region 16. Each of the semiconductor regions 32 may have a crystal orientation selected from (100), (110,) and (111) crystal orientations common to monocrystalline silicon. Each of the semiconductor regions 44 may have a crystal orientation (j',k',l') different from the crystal orientation (j,k,l) of the semiconductor regions 32 and selected from (100), (110) and (111) crystal orientations common to monocrystalline silicon. Alternatively, the crystal orientations (j,k,l), (j', k',l') of the semiconductor regions 32, 44 may be identical if the semiconductor layer 12 and bulk substrate 16 are selected accordingly.

Figure 12:
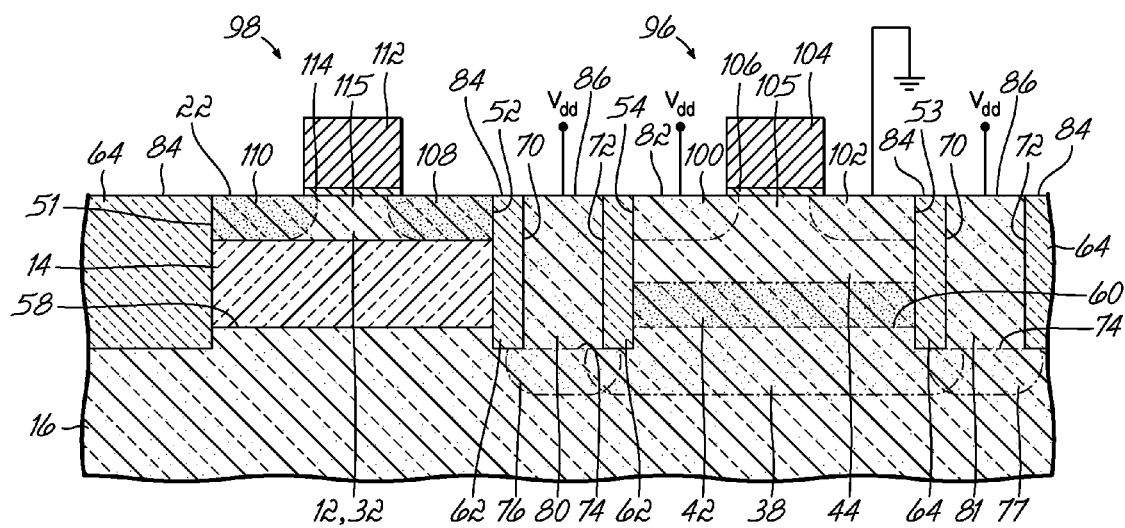

With reference to FIG. 12 in which like reference numerals refer to like features in FIG. 11 and at a subsequent fabrication stage, the semiconductor regions 32 and the semiconductor regions 44 are used to fabricate devices of an integrated circuit. The devices may comprise any type of conventional device structure including, but not limited to, field effect transistor (FET), such as, for example, n-channel metal oxide semiconductor (MOS) FET's, P-channel MOS FET's, complimentary metal oxide semiconductor (CMOS) FET's, and bipolar transistors such as lateral bipolar transistors. Persons having ordinary skill in the art comprehend the standard processing steps required to fabricate conventional integrated circuit devices using regions 32, 44 and that one or more devices may be fabricated in each of the regions 32, 44.

In a representative embodiment, n-channel transistors, including a representative n-channel transistor 96, are built using the semiconductor regions 44 and p-channel transistors, including a representative p-channel transistor 98, are built using the semiconductor regions 32 to define CMOS semiconductor structures. The transistors 96, 98 are fabricated using standard CMOS processing steps known to a person having ordinary skill in the art. Alternatively, the semiconductor regions 44, the semiconductor regions 32, or both may contain both types of transistors 96, 98. The top surfaces 22, 82, which are exposed at this fabrication stage, are used in building transistors 96, 98.

In the representative embodiment, each n-channel transistor 96 includes n-type diffusions in the semiconductor region 44 representing a drain region 100 and a source region 102 that flank opposite sides of a channel 105 in the semiconductor region 44, a gate electrode 104 that overlies the channel 105, and a gate dielectric 106 on the top surface 82 that electrically isolates the gate electrode 104 from the semiconductor material of the semiconductor region 44. Each p-channel transistor 98 includes p-type diffusions in the semiconductor region 32 representing a drain region 108 and a source region 110 that flank opposite sides of a channel 115 in the semiconductor region 32, a gate electrode 112 that overlies the channel 115, and a gate dielectric 114 on the top surface 22 that electrically isolates the gate electrode 112 from the semiconductor material of the semiconductor region 32. Other structures (not shown), such as sidewall spacers and halo regions, may be included in the construction of the transistors 96, 98. The transistors 96, 98 may have other types of device configurations.

The conductor constituting the gate electrodes 104, 112 may be, for example, polysilicon, silicide, metal, or any other appropriate material deposited by a CVD process, etc. The drain and source regions 100, 102 and the drain and source regions 108, 110 may be formed in the respective semiconductor regions 32, 44 by ion implantation of suitable dopant species having an appropriate conductivity type. The gate dielectrics 106, 114 may comprise any suitable dielectric or insulating material like silicon dioxide, silicon oxynitride, a high-k dielectric, or combinations of these materials. The dielectric material constituting dielectrics 106, 114 may have a thickness between about 1 nm and about 10 nm, and may be formed by thermal reaction of the semiconductor material of the respective semiconductor regions 32, 44 with a reactant, a CVD process, a PVD technique, or a combination thereof.

Each n-channel transistor 96 operates when a voltage greater than a characteristic threshold voltage is applied to the gate electrode 104. Applied voltages exceeding the threshold voltage generate an electric field across the channel 105 below the gate electrode 104 adequate to form a conductive path in the constituent semiconductor material between the drain and source regions 100, 102 allowing current to flow therebetween. Similarly, each p-channel transistor 98 operates when a sufficient voltage greater than a characteristic threshold voltage is applied to the gate electrode 112. Applied voltages exceeding the threshold voltage generate an electric field across the channel 105 below the gate electrode 112 sufficient to form a conductive path in the constituent semiconductor material between the drain and source regions 108, 110 allowing current to flow therebetween.

Each of the contacts 80, 81 is electrically coupled with the positive supply voltage (Vdd), as is the drain region 100 of the n-channel transistor 96. The conductive regions 76, 77 and the buried conductive region 38 are therefore biased at a relatively high voltage. Electrons from electron-hole pairs generated along the track of high-energy ionizing particles through the n-channel transistor 96 are collected by the buried conductive region 38 and then diverted harmlessly through the conductive regions 76, 77 into the contacts 80, 81. The initial electron spike into the drain region 100 is also greatly diminished by the presence of the buried conductive region 38. Furthermore, holes created in the bulk region 16 beneath the buried conductive region 38 are blocked by the hole potential energy barrier of the buried conductive region 38. The buried doped region 42 above each buried conductive region 38 presents a potential barrier to any electrons that escape collection and impedes their transport towards the drain and source regions 100, 102 of the n-channel transistor 96.

In an alternative embodiment of the invention, the static bias of the contacts 80, 81 can be switched with prior knowledge of an impending or an in process SEE event that may lead to an SEU or SEL. A device structure that operates as on chip radiation detector may be used to acquire SEE event knowledge, such as the device structure described in commonly-owned application Ser. No. 11/380,736, which is hereby incorporated by reference herein in its entirety. Using the output of such detectors, the bias to contacts 80, 81 can be switched on and off based on the knowledge of an SEE event. This enables the SEL structures to operate at their lowest power by only switching the power to contacts 80, 81 on when an SEE event is forecast.

In an alternative embodiment of the invention, a blanket conductive region analogous to the buried conductive region 38 (FIG. 12) is formed in the semiconductor structure that extends across the entire substrate 10 at a depth approximately equal to the bottom of the buried insulating layer 14.

Figure 13:
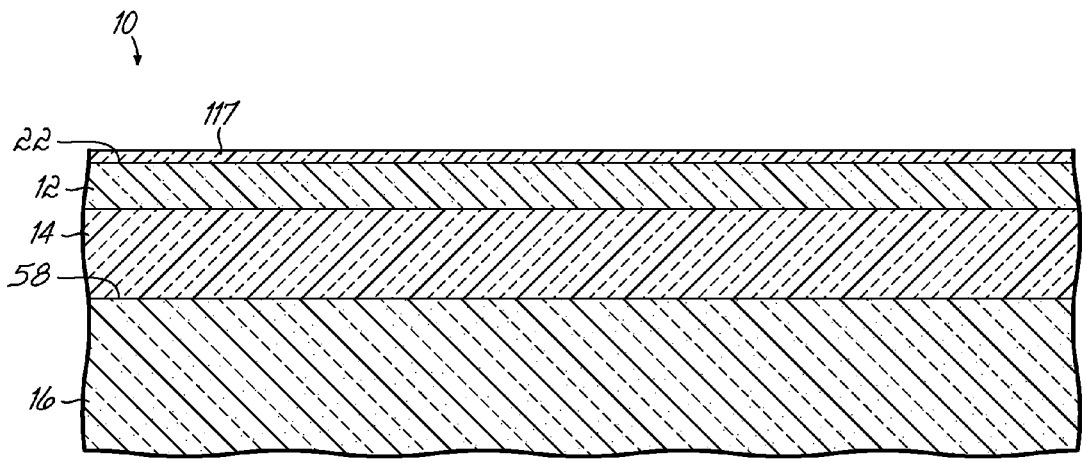
FIGS. 13-20 are diagrammatic cross-sectional views of a portion of a substrate at successive fabrication stages of a processing method in accordance with an alternative embodiment of the invention.

With reference to FIG. 13 in which like reference numerals refer to like features in FIG. 1 and at a subsequent fabrication stage, a sacrificial screen layer 117 is formed on the top surface 22 of the semiconductor layer 12. The screen layer 117 may comprise a $SiO_2$ thin film formed by a wet or dry oxidation process or by a conventional deposition process, such as CVD, to a thickness of about 5 nanometers to about 10 nanometers. The screen layer 117 acts to reduce ion channeling in the monocrystalline semiconductor material of bulk region 16 during a subsequent ion implantation step.

Figure 14:
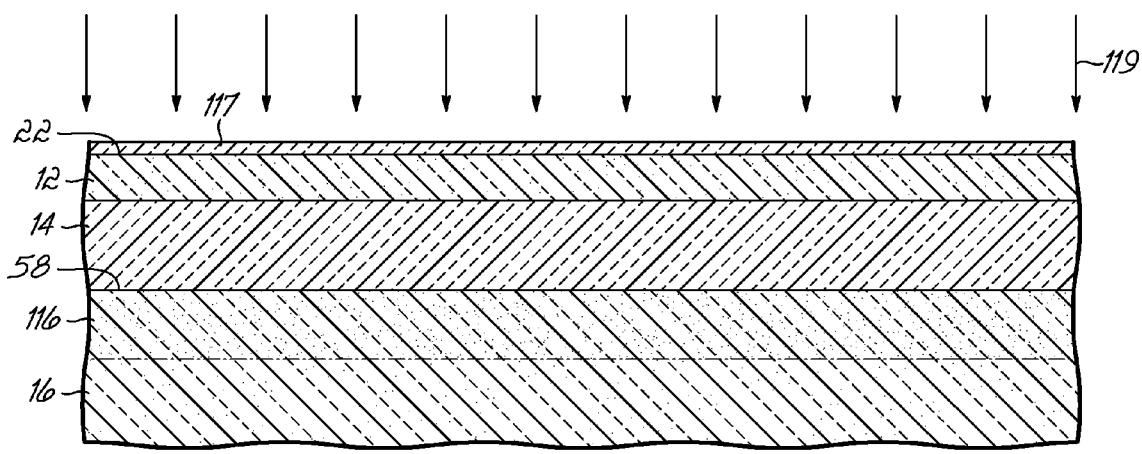

With reference to FIG. 14 in which like reference numerals refer to like features in FIG. 13 and at a subsequent fabrication stage, a buried conductive region 116 is defined in the semiconductor material of bulk region 16 at a depth proximate to the interface 58 between the buried insulating layer 14 and bulk region 16. Contingent upon the individual thicknesses of the semiconductor layer 12 and buried insulating layer 14, the buried conductive region 116 may lie at a depth beneath the top surface 22 of about 50 nanometers to about 300 nanometers.

The buried conductive region 116 may be formed by impinging the top surface 22 of the semiconductor layer 12 with a blanket implantation of ions 119 formed from a working gas containing an appropriate n-type or p-type dopant species. The ions 119 penetrate through the screen layer 117, semiconductor layer 12, and buried insulating layer 14 and then into the underlying semiconductor material of bulk region 16, where the ions 119 stop. The buried conductive region 116 has a conductivity type opposite to the conductivity type of the bulk region 16. For example, if the bulk region 16 is doped with a p-type dopant, the ions 119 may comprise an n-type dopant (e.g., arsenic or phosphorus) implanted at a kinetic energy selected to provide an appropriate projected range in the bulk region 16 and at a dose effective to provide peak concentration in the buried conductive region 116 of about $1 \times 10^{18}$ cm$^{-3}$ to about $1 \times 10^{20}$ cm$^{-3}$.

Figure 15:
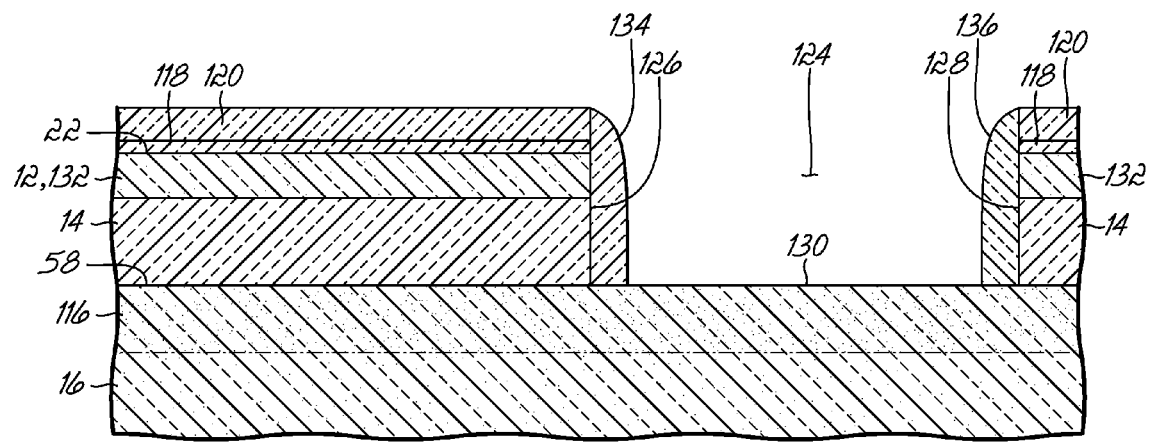

With reference to FIG. 15 in which like reference numerals refer to like features in FIG. 14 and at a subsequent fabrication stage, the screen layer 117 (FIG. 13) is removed by an etching process selective to the material of the semiconductor layer 12. Optionally, the screen layer 117 may remain on the top surface 22 until removed in a subsequent processing step. Processing continues as substantially described hereinabove with regard to FIG. 2.

To that end, a pad stack consisting of first and second pad layers 118, 120, which are substantially identical in construction to pad layers 18, 20 (FIG. 2) and are fabricated by substantially identical processes, is formed on a top surface 22 of semiconductor layer 12. Openings, of which a single representative opening 124 is shown, are formed by a conventional lithography and etching process that utilizes a pattern imparted in the pad layers 118, 120. The openings 124 are substantially identical in construction to openings 24 (FIG. 2) and are formed by substantially identical process steps.

Each opening 124 defines a window extending through the thickness of semiconductor layer 12 and the buried insulating layer 14 to expose a respective surface area of bulk region 16. Similar to openings 24, each of the openings 124 includes opposite sidewalls 126, 128 that extend through semiconductor layer 12 and buried insulating layer 14 to a bottom surface or base 130 that is coextensive with, or intersects, the bulk region 16. At the conclusion of the conventional lithography and etching process, the semiconductor layer 12 includes a plurality of semiconductor regions 132 of semiconductor material having the first crystal orientation (j,k,l) of the semiconductor layer 12 (FIG. 1). Adjacent semiconductor regions 132 are separated by one of the openings 124.

Insulating dielectric spacers 134, 136 are formed on the respective sidewalls 126, 128 of each opening 124 and extend from a top surface of the pad layer 120 to the base 130. The spacers 134, 136 are substantially identical in construction to dielectric spacers 34, 36 (FIG. 2) and are formed by substantially identical processes.

Figure 16:
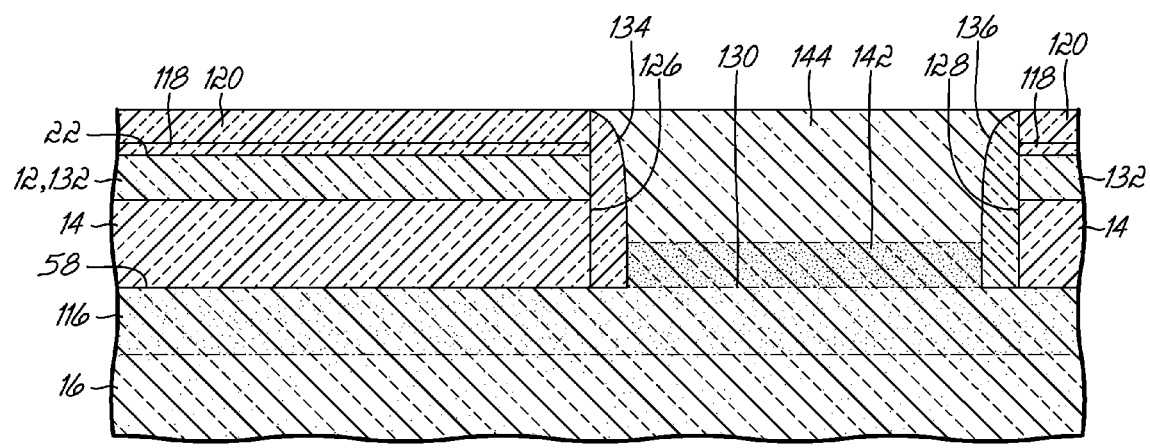

With reference to FIG. 16 in which like reference numerals refer to like features in FIG. 15 and at a subsequent fabrication stage, processing continues as substantially described hereinabove with regard to FIG. 4. Each of the openings 124 is filled with a buried doped layer 142 of epitaxial semiconductor material and a semiconductor layer 144 of epitaxial semiconductor material. The buried doped layer 142 and semiconductor layer 144 are substantially identical in construction to buried doped region 42 and semiconductor layer 144 (FIG. 4), respectively, and are formed by substantially identical process steps. The crystal orientations (j,k,l), (j',k',l') of regions 132, 144 may be identical or different, as described herein with regard to regions 32, 44.

In an alternative embodiment, at least one of the spacers 134, 136 is fabricated from a conductive material, such as polysilicon, tungsten, or tungsten silicide (WSi), rather than an insulator. In this alternative configuration, the semiconductor regions 144 may be used as a common connection to the semiconductor regions 132 and the bulk region 16. The spacers 134 and/or spacers 136, conductive region 138, buried doped regions 142, and semiconductor regions 144 are all doped with the same conductivity type (i.e., either p-type or n-type) contingent upon the desired polarity of the interconnect. The spacers 134, 136 supply a conductive transition layer that provides an electrical connection between the two crystal orientations of the semiconductor regions 132 and the semiconductor regions 144. This conductive transition layer permits the two different orientations to connect with each other without causing structural defects between the two regions 132, 144.

In another alternative embodiment, the doping of the semiconductor layer 144, the buried doped layer 142, and buried conductive region 138 can be adjusted such that the buried doped layer 142 has an opposite conductivity type than the buried conductive region 138 and the semiconductor layer 144. For example, buried doped layer 142 may be doped with a p-type impurity, and the bulk device region 144 and buried conductive region 138 may be doped with an n-type impurity to define a vertical n-p-n bipolar transistor coupled with the bulk region 16.

Figure 17:
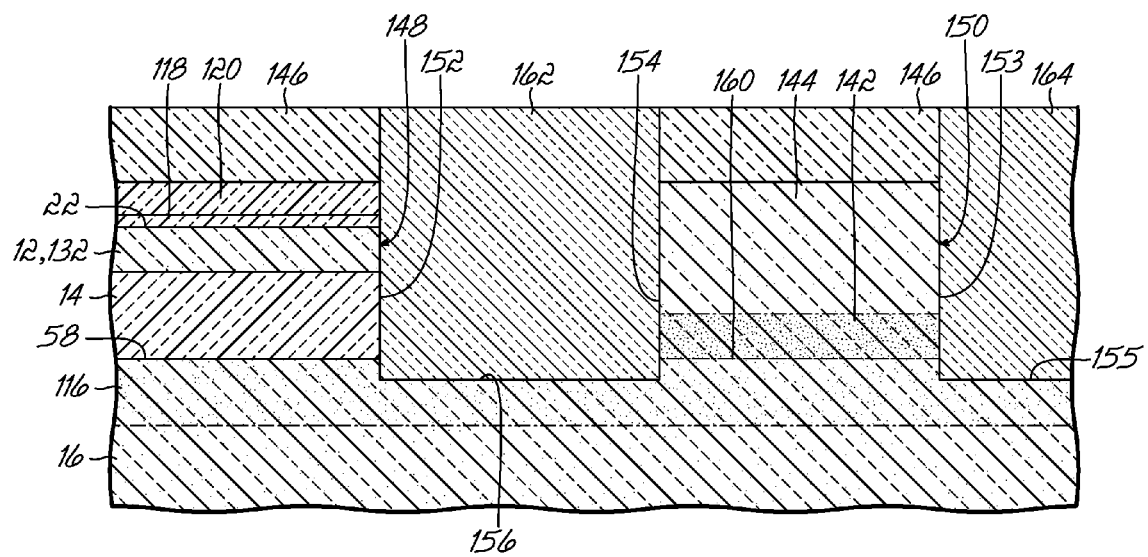

With reference to FIG. 17 in which like reference numerals refer to like features in FIG. 16 and at a subsequent fabrication stage, a pad layer 146 is deposited on the pad layer 120 and the semiconductor regions 144. The pad layer 146 is substantially identical in construction to pad layer 46 (FIG. 5) and is formed by a substantially identical process. An optional thin pad layer (not shown) may be disposed between pad layers 120 and 146, as described above with regard to FIG. 5.

Processing continues as described hereinabove with regard to FIGS. 6 and 7 to form shallow isolation trenches 148, 150 and shallow trench isolation regions 162, 164 in the shallow isolation trenches 148, 150. The shallow isolation trenches 148, 150 and shallow trench isolation regions 162, 164 are substantially identical in construction to shallow isolation trenches 48, 50 (FIG. 6) and shallow trench isolation regions 62, 64 (FIG. 7) and are formed by a substantially identical processes. The shallow trench isolation regions 162, 164 operate to electrically isolate adjacent semiconductor regions 132, 144.

The shallow isolation trenches 148, 150 are disposed on opposite sides of the buried doped layer 142 and semiconductor layer 144. Shallow isolation trench 148 includes opposite, spaced-apart sidewalls 152, 154 that extend into the bulk region 16 to a base 156. Shallow isolation trench 150 includes opposite, spaced-apart sidewalls, of which only sidewall 153 is visible in FIG. 17, that extend into the bulk region 16 to a base 155. The bases 155, 156 are located at a depth relative to top surface 22 below the depth of the coextensive interface 58 between the buried insulating layer 14 and bulk region 16. The bases 155, 156 are also located at a depth greater than the depth of a coextensive junction or interface 160 between the buried conductive region 116 and the buried doped layer 142. Interface 160 is positioned approximately at the former depth of the base 130 of the openings 124 (FIG. 15). In one embodiment, the bases 155, 156 are located at a depth in the bulk region 16 that is about 10 nanometers to about 50 nanometers deeper than interface 58.

Figure 18:
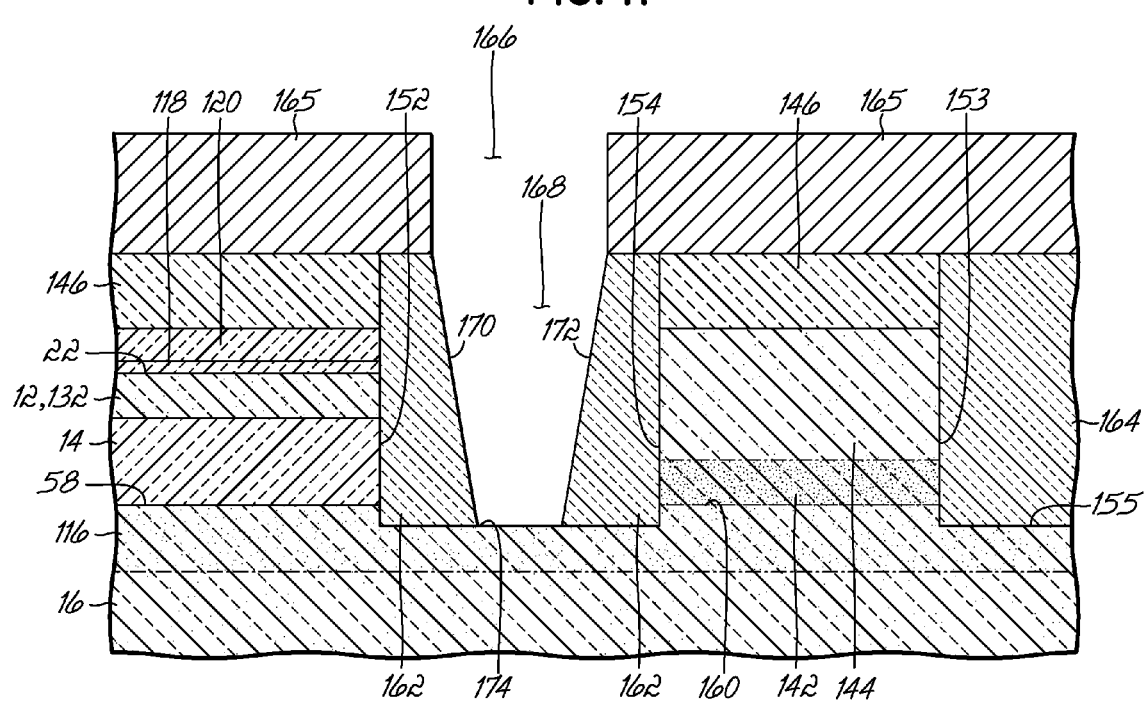

With reference to FIG. 18 in which like reference numerals refer to like features in FIG. 17 and at a subsequent fabrication stage, a layer 165 of a resist is applied to pad layer 146 and shallow trench isolation regions 162, 164, and then patterned using a conventional photolithography process to define via openings, of which via opening 166 is representative. An anisotropic etching process is used to etch a via 168 in each of the shallow trench isolation regions 162 at the location of via opening 166 in the patterned resist layer 165. The anisotropic dry etching process may be conducted in a single etching step or multiple etching steps with different etch chemistries. The via 168 includes sidewalls 170, 172 that extend completely through shallow isolation trench 148 to a base 174 that is approximately at the former depth of base 156 (FIG. 17). A surface area of the bulk region 16 and, more particularly, the buried conductive region 116 is exposed by the base 174 of each via 168. The via 168 is adjacent to the buried doped layer 142 and semiconductor layer 144.

The patterned resist layer 165 may comprise a standard patterned resist layer used in the fabrication of the integrated circuit on substrate 10 that has been modified to incorporate via openings 166. As a result, the process step forming via openings 166 may be seamlessly integrated into the standard CMOS fabrication process.

Figure 19:
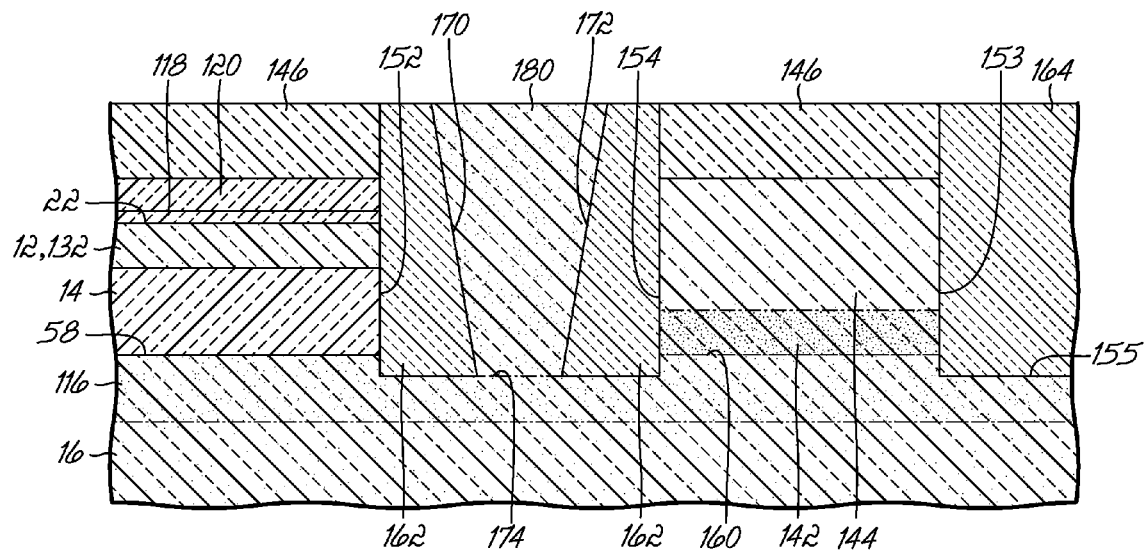

With reference to FIG. 19 in which like reference numerals refer to like features in FIG. 18 and at a subsequent fabrication stage, the resist layer 165 (FIG. 18) is stripped, for example, by plasma ashing or with a chemical stripper. A stud or contact 180 is formed in each of the vias 168. Contact 180 is substantially identical in construction to contact 80 (FIGS. 10-12) and is fabricated by substantially identical process steps. Each contact 180 is electrically coupled with the buried conductive region 116, but is electrically isolated from the semiconductor regions 132, 144 by intervening portions of shallow trench isolation region 162. The invention contemplates that an additional via and contact (not shown) similar to via 168 and contact 180 may be formed in the shallow trench isolation region 164.

Figure 20:
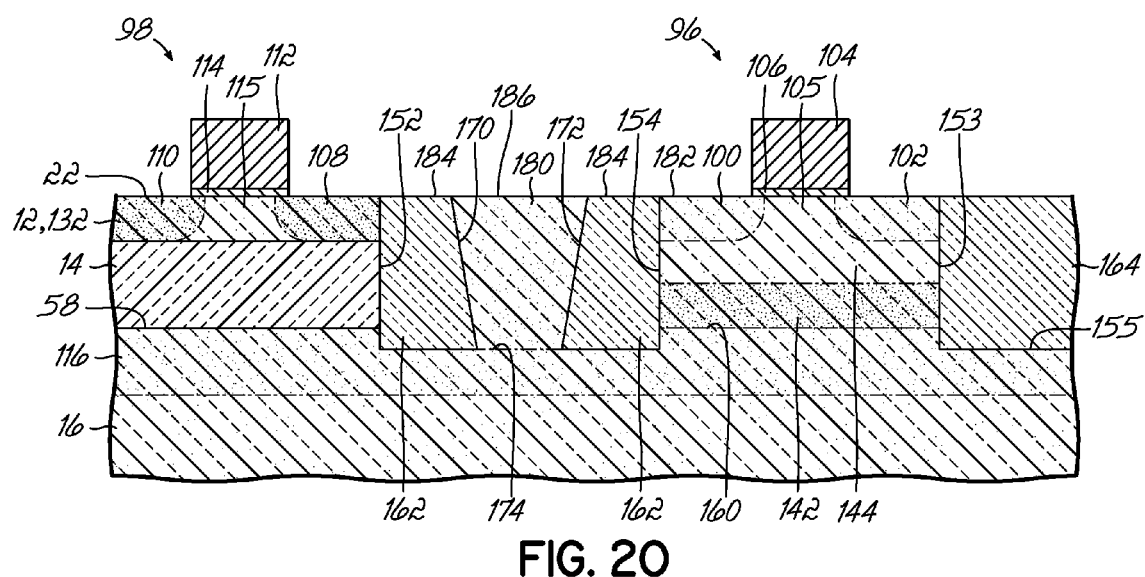

With reference to FIG. 20 in which like reference numerals refer to like features in FIG. 19 and at a subsequent fabrication stage, the pad layers 18, 20, 146 (FIG. 19) are removed to expose the top surface 22 of each semiconductor region 132 and a top surface 182 of each semiconductor layer 144. The top surfaces 22, 182 are approximately co-planar with a top surface 184 of the shortened shallow trench isolation regions 162, 164 and a top surface 186 of the shortened contacts 180. The removal and co-planarization may be accomplished, for example, by a conventional CMP process. Each semiconductor region 132 is electrically isolated from the bulk region 16 by an underlying residual portion of the buried insulating layer 14 and is flanked by shallow trench isolation regions 162, 164 that extend from the top surface 22 to the buried insulating layer 14. Each semiconductor layer 144 is physically coupled with the bulk region 16.

Each semiconductor region 132 has a crystal orientation determined by the crystal orientation (j,k,l) of the semiconductor layer 12. Each semiconductor layer 144 have a crystal orientation determined by the crystal orientation (j',k',l') of the bulk region 16. Each of the semiconductor regions 132 may have a crystal orientation selected from (100), (110), and (111) crystal orientations common to monocrystalline silicon. Each of the semiconductor regions 144 may have a crystal orientation different from the crystal orientation of the semiconductor regions 132, but selected from (100), (110), and (111) crystal orientations common to monocrystalline silicon. Alternatively, the crystal orientations (j,k,l), (j',k',l') of the semiconductor regions 132, 144 may be identical.

Devices are fabricated using the semiconductor regions 132, 144, as described above with regard to FIG. 12. In a representative embodiment and although the invention is not so limited, n-channel transistors, including the representative n-channel transistor 96, are built using the semiconductor regions 144 and p-channel transistors, including the representative p-channel transistor 98, are built using the semiconductor regions 132 to define CMOS semiconductor structures. The transistors 96, 98 are fabricated with standard CMOS processing steps known to a person having ordinary skill in the art and as described above with regard to FIG. 12.

Each contact 180 and the drain region 100 of the n-channel transistor 96 are electrically coupled with the positive supply voltage (Vdd). The buried conductive region 116 is therefore biased at a relatively high voltage, i.e., Vdd. Electrons from electron-hole pairs generated along the track of high-energy ionizing particles penetrating through the n-channel transistor 96 are collected by the buried conductive region 116 and then diverted harmlessly into the contact 180.

In an alternative embodiment of the invention, the static bias of the contacts 80 can be switched with prior knowledge of an impending or an in process SEE event that may lead to an SEU or SEL. Using the output of a device structure that operates as on chip radiation detector for acquiring SEE event knowledge such detectors, the bias to contacts 180 can be switched on and off based on the knowledge of an SEE event. This enables the SEL structures to operate at their lowest power by only switching the power on to contacts 180 when an SEE event is forecast.

The initial electron spike into the drain region 100 is also greatly diminished by the presence of the buried conductive region 116. Furthermore, holes created in the bulk region 16 beneath the buried conductive region 116 are blocked by the hole potential energy barrier of the buried conductive region 116. The buried doped layer 142 above each buried conductive region 116 presents a potential barrier to any electrons that escape collection and impedes their transport towards the drain and source regions 100, 102 of the n-channel transistor 96.

The buried conductive region 116 also extends under the buried insulating layer 14 and semiconductor regions 132, which operates to suppress backside parasitic leakage in the p-channel transistor 98 fabricated using each semiconductor region 132. In the embodiment of the invention described in connection with FIGS. 1-12, the conductive regions 76 and buried conductive region 38 define a discontinuous conductive layer in the semiconductor material of the bulk region 16 that does not extend beneath the semiconductor regions 32.

References herein to terms such as "vertical", "horizontal", etc. are made by way of example, and not by way of limitation, to establish a frame of reference. The term "horizontal" as used herein is defined as a plane parallel to a conventional plane of a semiconductor wafer or substrate, regardless of its actual three-dimensional spatial orientation. The term "vertical" refers to a direction perpendicular to the horizontal, as just defined. Terms, such as "on", "above", "below", "side" (as in "sidewall", "higher", "lower", "over", "beneath" and "under", are defined with respect to the horizontal plane. It is understood that various other frames of reference may be employed for describing the invention without departing from the spirit and scope of the invention. The term "on" used in the context of two layers means at least some contact between the layers. The term "over" means two layers that are in close proximity, but possibly with one or more additional intervening layers such that contact is possible but not required. As used herein, neither "on" nor "over" implies any directionality.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of forming a semiconductor structure using a semiconductor-on-insulator substrate having a semiconductor layer, a bulk semiconductor region of a first conductivity type underlying the semiconductor layer, and an insulating layer between the semiconductor layer and the bulk semiconductor region, the method comprising:

forming an opening having sidewalls extending from a top surface of the semiconductor layer through the semiconductor layer and the insulating layer to a base intersecting the bulk semiconductor region;

forming a conductive region of a second conductivity type opposite to the first conductivity type and disposed in the bulk semiconductor region proximate to the base of the opening;

partially filling the opening with a first epitaxial layer of a semiconductor material epitaxially grown toward the top surface from the base of the opening and doped with the first conductivity type at a first doping concentration; and filling a remaining open space inside the opening to the top surface with a second epitaxial layer of the semiconductor material epitaxially grown toward the top surface of the opening from the first epitaxial layer and doped with the first conductivity type at a second doping concentration lower than the first doping concentration or doped with the second conductivity type.

2. The method of claim 1 wherein forming the conductive region further comprises:

covering regions of the semiconductor layer adjacent to the opening with an implant mask; and implanting ions of a dopant capable of providing the second conductivity type into the bulk semiconductor region beneath the base of the opening.

3. The method of claim 1 wherein the semiconductor material of the second epitaxial layer is doped with the first conductivity type at the second doping concentration.

4. The method of claim 3 further comprising:

partially filling the opening between the base and the semiconductor material doped at the first doping concentration with a third epitaxial layer of the semiconductor material doped with the first conductivity type at a third doping concentration less than the first doping concentration.

5. The method of claim 1 wherein the semiconductor material of the second epitaxial layer is doped with the second conductivity type to define a vertical transistor.

6. The method of claim 1 further comprising:

forming conductive spacers on the sidewalls of the opening before filling the opening with the semiconductor material.

7. The method of claim 1 wherein the the semiconductor material of the second epitaxial layer has the first conductivity type, and further comprising:
forming a first field effect transistor with source and drain regions of the second conductivity type in the semiconductor material filling the opening.

8. The method of claim 7 wherein the semiconductor layer has the second conductivity type, and further comprising:
forming a second field effect transistor with source and drain regions of the first conductivity type in the semiconductor layer.

9. The method of claim 1 wherein forming the conductive region further comprises:
implanting ions of a dopant capable of providing the second conductivity type through the semiconductor layer and the insulating layer and into the bulk semiconductor region before the opening is formed.

10. The method of claim 1 further comprising:
forming a shallow trench isolation region of a dielectric material adjacent to the filled opening and extending from the top surface into the bulk semiconductor region so as to intersect the conductive region;
forming a via in the shallow trench isolation region that extends from the top surface to intersect the conductive region;
doping the bulk semiconductor region exposed by the via with a dopant having the second conductivity type to define another conductive region in the substrate that overlaps with the conductive region in the substrate between the filled trench and the bulk semiconductor region; and
filling the via with a conductive material to form a conductive stud that electrically contacts the conductive region.

11. A method of forming a semiconductor structure using a semiconductor-on-insulator substrate having a semiconductor layer, a bulk semiconductor region of a first conductivity type underlying the semiconductor layer, and an insulating layer between the semiconductor layer and the bulk semiconductor region, the method comprising:
implanting ions of a dopant capable of providing the second conductivity type through the semiconductor layer and the insulating layer and into the bulk semiconductor region to form a conductive region of a second conductivity type opposite to the first conductivity type and disposed in the bulk semiconductor region;
after implanting the ions, forming an opening having sidewalls extending from a top surface of the semiconductor layer through the semiconductor layer and the insulating layer to a base intersecting the bulk semiconductor region;
partially filling the opening proximate to the base with a first epitaxial layer of a semiconductor material epitaxially grown toward the top surface from the base of the opening and doped with the first conductivity type at a first doping concentration; and
filling a remaining open space inside the opening to the top surface with a second epitaxial layer of the semiconductor material doped with the first conductivity type at a second doping concentration lower than the first doping concentration.

12. The method of claim 11 further comprising:
partially filling the opening between the base and the first epitaxial layer of the semiconductor material doped at the first doping concentration with a third epitaxial layer of the semiconductor material doped with the first conductivity type at a third doping concentration less than the first doping concentration.

13. The method of claim 11 further comprising:
forming conductive spacers on the sidewalls of the opening before filling the opening with the semiconductor material.

14. The method of claim 11 wherein the semiconductor material filling the opening has the first conductivity type, and further comprising:
forming a first field effect transistor with source and drain regions of the second conductivity type in the semiconductor material filling the opening.

15. The method of claim 14 wherein the semiconductor layer has the second conductivity type, and further comprising:
forming a second field effect transistor with source and drain regions of the first conductivity type in the semiconductor layer.

16. A method of forming a semiconductor structure using a semiconductor-on-insulator substrate having a semiconductor layer, a bulk semiconductor region of a first conductivity type underlying the semiconductor layer, and an insulating layer between the semiconductor layer and the bulk semiconductor region, the method comprising:
forming an opening having sidewalls extending from a top surface of the semiconductor layer through the semiconductor layer and the insulating layer to a base intersecting the bulk semiconductor region;
forming a conductive region of a second conductivity type opposite to the first conductivity type and disposed in the bulk semiconductor region proximate to the base of the opening; and
filling the opening with a semiconductor material epitaxially grown toward the top surface from the base of the opening;
forming a shallow trench isolation region of a dielectric material adjacent to the filled opening and extending from the top surface into the bulk semiconductor region so as to intersect the conductive region;
forming a via in the shallow trench isolation region that extends from the top surface to intersect the conductive region;
doping the bulk semiconductor region exposed by the via with a dopant having the second conductivity type to define another conductive region in the substrate that overlaps with the conductive region in the substrate between the filled trench and the bulk semiconductor region; and
filling the via with a conductive material to form a conductive stud that electrically contacts the conductive region.

17. The method of claim 16 wherein doping the bulk semiconductor region further comprises:
implanting ions of the dopant having the second conductivity type into a surface area of the bulk semiconductor region exposed by the via.

18. The method of claim 16 wherein the semiconductor material filling the opening and the bulk substrate have a different crystalline orientation than the semiconductor layer, and further comprising:
forming dielectric spacers on the sidewalls of the opening, before filling the opening with the semiconductor material, that are removed when the shallow trench isolation region is formed.

19. The method of claim 16 wherein forming the conductive region further comprises:
implanting ions of a dopant capable of providing the second conductivity type through the semiconductor layer and the insulating layer and into the bulk semiconductor region before the opening is formed.

20. The method of claim 16 wherein forming the conductive region further comprises:
covering regions of the semiconductor layer adjacent to the opening with an implant mask; and
implanting ions of a dopant capable of providing the second conductivity type into the bulk semiconductor region beneath the base of the opening.

21. The method of claim 16 wherein filling the opening further comprises:
partially filling the opening proximate to the base with a first epitaxial layer of the semiconductor material doped with the first conductivity type at a first doping concentration; and
filling a remaining open space inside the opening to the top surface with a second epitaxial layer of the semiconductor material doped with the first conductivity type at a second doping concentration lower than the first doping concentration.

22. The method of claim 21 further comprising:
partially filling the opening between the base and the semiconductor material doped at the first doping concentration with a third epitaxial layer of the semiconductor material doped with the first conductivity type at a third doping concentration less than the first doping concentration.

23. The method of claim 16 wherein filling the opening further comprises:
partially filling the opening proximate to the base with a first epitaxial layer of the semiconductor material doped with the second conductivity type; and
filling remaining open space inside the opening to the top surface with a second epitaxial layer of the semiconductor material doped with the first conductivity type to define a vertical transistor.

24. The method of claim 16 further comprising:
forming conductive spacers on the sidewalls of the opening before filling the opening with the semiconductor material.

25. The method of claim 16 wherein the semiconductor material filling the opening has the first conductivity type, and further comprising:
forming a first field effect transistor with source and drain regions of the second conductivity type in the semiconductor material filling the opening.

26. The method of claim 25 wherein the semiconductor layer has the second conductivity type, and further comprising:
forming a second field effect transistor with source and drain regions of the first conductivity type in the semiconductor layer.

\* \* \* \* \*